(12) United States Patent
Shin et al.

(10) Patent No.: US 12,557,529 B2
(45) Date of Patent: Feb. 17, 2026

(54) DISPLAY DEVICE AND METHOD OF MANUFACTURING THE DISPLAY DEVICE

(71) Applicant: Samsung Display Co., Ltd., Yongin-si (KR)

(72) Inventors: Sukyeong Shin, Yongin-si (KR); Joonhwa Bae, Yongin-si (KR); Heesung Yang, Yongin-si (KR); Woojin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 652 days.

(21) Appl. No.: 17/975,361

(22) Filed: Oct. 27, 2022

(65) Prior Publication Data

US 2023/0138392 A1 May 4, 2023

(30) Foreign Application Priority Data

Nov. 1, 2021 (KR) .......................... 10-2021-0148261

(51) Int. Cl.
| | |
|---|---|
| *H10K 59/80* | (2023.01) |
| *H10K 59/122* | (2023.01) |
| *H10K 59/124* | (2023.01) |
| *H10K 59/126* | (2023.01) |
| *H10K 59/38* | (2023.01) |
| *H10K 59/12* | (2023.01) |
| *H10K 102/00* | (2023.01) |

(52) U.S. Cl.
CPC ......... *H10K 59/873* (2023.02); *H10K 59/122* (2023.02); *H10K 59/124* (2023.02); *H10K 59/126* (2023.02); *H10K 59/38* (2023.02); *H10K 59/1201* (2023.02); *H10K 2102/331* (2023.02)

(58) Field of Classification Search
CPC .. H10K 50/844; H10K 59/124; H10K 59/126; H10K 59/1201; H10K 2102/331; H10K 59/8723; H10K 59/873; H10K 50/8426; H10K 50/8445
See application file for complete search history.

(56) References Cited

U.S. PATENT DOCUMENTS

| | | | |
|---|---|---|---|
| 6,540,576 B1 | 4/2003 | Watanabe et al. | |
| 10,185,066 B2 | 1/2019 | Chae et al. | |
| 10,319,938 B2 | 6/2019 | Choi et al. | |
| 11,569,306 B2 | 1/2023 | Lim et al. | |
| 2020/0091256 A1* | 3/2020 | Kim | H10K 77/111 |

FOREIGN PATENT DOCUMENTS

| | | |
|---|---|---|
| KR | 10-0392284 B1 | 7/2003 |
| KR | 10-2018-0009845 A | 1/2018 |
| KR | 10-2018-0018945 A | 2/2018 |
| KR | 10-2066079 B1 | 1/2020 |
| KR | 10-2021-0116730 A | 9/2021 |

* cited by examiner

*Primary Examiner* — Fernando L Toledo
*Assistant Examiner* — Adam S Bowen
(74) *Attorney, Agent, or Firm* — Womble Bond Dickinson (US) LLP

(57) ABSTRACT

A display device and a method of manufacturing the display device are provided. The display device includes a substrate having a display area in which a plurality of pixels are arranged, a plurality of bank layers arranged on the substrate and defining opening areas respectively corresponding to the plurality of pixels, and a bank protection layer at an outermost portion of the plurality of bank layers.

43 Claims, 17 Drawing Sheets

DISPLAY DEVICE AND METHOD OF MANUFACTURING THE DISPLAY DEVICE

CROSS-REFERENCE TO RELATED APPLICATION

This application claims priority to and the benefit of Korean Patent Application No. 10-2021-0148261, filed on Nov. 1, 2021, in the Korean Intellectual Property Office, the entire content of which is hereby incorporated by reference.

BACKGROUND

1. Field

One or more embodiments of the present disclosure relate to a device and method, and for example, to a display device and a method of manufacturing the display device.

2. Description of the Related Art

Electronic devices based on mobility are widely utilized. As mobile electronic devices, in addition to small electronic devices, such as mobile phones, tablet personal computers (PC), etc., have been widely utilized in recent years.

Such a mobile electronic device includes a display unit that supports one or more suitable functions and provides visual information such as an image or a video to a user. Recently, as the size of other components for driving a display unit has been reduced, the proportion of the display unit in an electronic device has gradually increased, and a structure that may be bent to a certain angle with respect to a flat state has been developed.

SUMMARY

In one or more embodiments of the present disclosure, a bank (or a bank layer) defining a certain area may be arranged in a display device to arrange a quantum dot material (or a quantum dot layer) in the certain area. Because the quantum dot is supplied in the form of droplets, a center of an area formed by the bank may be slightly lower than other portions. Because of this, it is necessary to make an upper end of the bank and an upper end of the quantum dot layer as flat as possible by grinding a certain portion of the bank through a polishing device or by another similar process that should be apparent to one of ordinary skill in the art upon reviewing the disclosure. When the upper end of the bank is polished, a pressure of the polishing device is not substantially uniform. Therefore, a thin-film encapsulation layer at an edge portion of the display device may be lifted. Aspects of embodiments of the present disclosure are directed toward a display device including a structure for reducing a lifting phenomenon of a thin-film encapsulation layer at a lower end of a bank when an upper end of the bank is polished by utilizing a polishing device, and a method of manufacturing the display device.

Additional aspects of embodiments will be set forth in part in the description which follows and, in part, will be apparent from the description, or may be learned by practice of the presented embodiments of the disclosure.

According to one or more embodiments, a display device includes a substrate including a display area in which a plurality of pixels are arranged, a plurality of bank layers arranged on the substrate and defining opening areas respectively corresponding to the plurality of pixels, and a bank protection layer at an outermost portion of the plurality of bank layers.

In an embodiment of the present disclosure, the bank protection layer may be at an outer portion of an edge of the display area.

In an embodiment of the present disclosure, a first distance from an upper end of a first portion of the bank protection layer to one surface of the substrate may be different from a second distance from an upper end of a second portion of the bank protection layer to the one surface of the substrate.

In an embodiment of the present disclosure, the first distance may be greater than the second distance.

In an embodiment of the present disclosure, the first portion may be closer to the display area than the second portion may be to the display area.

In an embodiment of the present disclosure, a distance from an upper end of the bank protection layer to one surface of the substrate may decrease in a first direction.

In an embodiment of the present disclosure, the first direction may be a direction away from the display area.

In an embodiment of the present disclosure, an upper end of the bank protection layer may be substantially rounded.

In an embodiment of the present disclosure, the bank protection layer may include an inorganic material and/or an organic material.

In an embodiment of the present disclosure, the bank protection layer may include a material different from a material of the plurality of bank layers.

In an embodiment of the present disclosure, the bank protection layer may surround edges of the display area.

In an embodiment of the present disclosure, the bank protection layer may have a closed-loop shape.

In an embodiment of the present disclosure, a plurality of bank protection layers may be provided, and the plurality of bank protection layers may be spaced apart from each other in a direction away from the edge of the display area.

In an embodiment of the present disclosure, a plurality of bank protection layers may be provided, and the plurality of bank protection layers may be spaced apart from each other along the edge of the display area.

In an embodiment of the present disclosure, the display device may further include a plurality of quantum dot layers between adjacent bank layers among the plurality of bank layers.

In an embodiment of the present disclosure, the display device may further include a color filter layer arranged on the plurality of quantum dot layers and the plurality of bank layers and configured to modify colors.

In an embodiment of the present disclosure, the display device may further include a thin-film encapsulation layer arranged between the substrate and the plurality of bank layers and configured to shield the display area.

In an embodiment of the present disclosure, the thin-film encapsulation layer may include a first inorganic encapsulation layer configured to shield the display area, an organic encapsulation layer on the first inorganic encapsulation layer, and a second inorganic encapsulation layer on the organic encapsulation layer.

In an embodiment of the present disclosure, the bank protection layer may be configured to shield an end of the first inorganic encapsulation layer and an end of the second inorganic encapsulation layer.

In an embodiment of the present disclosure, the display device may further include a dam unit on the substrate.

In an embodiment of the present disclosure, the bank protection layer may be configured to shield the dam unit.

According to one or more embodiments, a display device includes a substrate including a display area in which a plurality of pixels are arranged, a thin-film encapsulation layer arranged on the substrate to cover the display area, a plurality of bank layers arranged on the thin-film encapsulation layer and defining opening areas respectively corresponding to the plurality of pixels, and a bank protection layer arranged at an outermost portion of the plurality of bank layers and having a variable distance from one surface of the substrate to an upper surface of the bank protection layer.

In an embodiment of the present disclosure, an end of the thin-film encapsulation layer may be below the bank protection layer.

In an embodiment of the present disclosure, the display device may further include a dam unit on the substrate and below the bank protection layer.

In an embodiment of the present disclosure, the display device may further include a plurality of quantum dot layers between adjacent bank layers among the plurality of bank layers.

In an embodiment of the present disclosure, the display device may further include a color filter layer arranged on the plurality of quantum dot layers and the plurality of bank layers and configured to modify colors.

In an embodiment of the present disclosure, the bank protection layer may have a closed-loop shape.

In an embodiment of the present disclosure, a plurality of bank protection layers may be provided, and the plurality of bank protection layers may be spaced apart from each other in a direction away from the edge of the display area.

In an embodiment of the present disclosure, a plurality of bank protection layers may be provided, and the plurality of bank protection layers may be spaced apart from each other along the edge of the display area.

According to one or more embodiments, a method of manufacturing a display device includes forming a plurality of pixels spaced apart from each other on a substrate, forming a thin-film encapsulation layer on a display area defined by the plurality of pixels, and forming, on the thin-film encapsulation layer, a plurality of bank layers and a bank protection layer at an outermost portion of the plurality of bank layers to define a plurality of opening areas respectively corresponding to the plurality of pixels.

In an embodiment of the present disclosure, the method may further include polishing the plurality of bank layers and the bank protection layer.

In an embodiment of the present disclosure, the polishing of the bank protection layer may include polishing the bank layer so that a first distance from an upper end of a first portion of the bank protection layer to one surface of the substrate is different from a second distance from an upper end of a second portion of the bank protection layer to the one surface of the substrate.

In an embodiment of the present disclosure, the first distance may be greater than the second distance.

In an embodiment of the present disclosure, the first portion may be closer to the display area than the second portion may be to the display area.

In an embodiment of the present disclosure, the polishing of the bank protection layer may include polishing the bank protection layer such that a distance from an upper end of the bank protection layer to one surface of the substrate decreases in a first direction.

In an embodiment of the present disclosure, an upper end of the bank protection layer may be polished to be substantially rounded.

In an embodiment of the present disclosure, the bank protection layer may include an inorganic material and/or an organic material.

In an embodiment of the present disclosure, the bank protection layer may have a closed-loop shape.

In an embodiment of the present disclosure, the forming of the bank protection layer may include forming a first bank protection layer at an outer portion of an edge of the display area, and forming a second bank protection layer at an outer portion of the first bank protection layer.

In an embodiment of the present disclosure, the method may further include forming a dam unit in an area of the substrate at an outer portion of the display area.

In an embodiment of the present disclosure, the bank protection layer may be configured to shield the dam unit.

In an embodiment of the present disclosure, the method may further include arranging a plurality of quantum dot layers to respectively correspond to the plurality of opening areas.

In an embodiment of the present disclosure, the method may further include arranging a color filter layer on the plurality of bank layers and the plurality of quantum dot layers.

Other aspects and features other than those described above will now become apparent from the following drawings, claims, and the detailed description of the disclosure.

These general and specific aspects may be embodied utilizing a system, a method, a computer program, or a combination of any system, method, and computer program.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
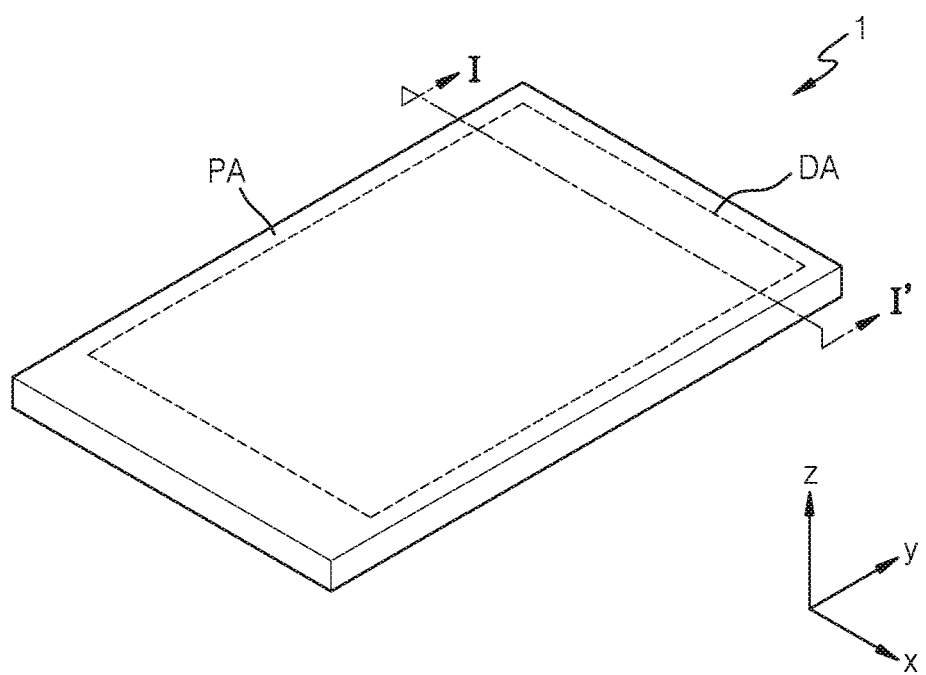
FIG. 1 is a schematic perspective view of a display device according to an embodiment.

Reference will now be made in more detail to embodiments, examples of which are illustrated in the accompanying drawings, wherein like reference numerals refer to like elements throughout, and duplicative descriptions thereof may not be provided. In this regard, the embodiments of the present disclosure may have different forms and should not be construed as being limited to the descriptions set forth herein. Accordingly, the embodiments are described below, by referring to the drawings, to explain aspects of embodiments of the present disclosure. As used herein, the term "and/or" includes any and all combinations of one or more of the associated listed items. Throughout the disclosure, the expression "at least one of a, b and c" indicates only a, only b, only c, both (e.g., simultaneously) a and b, both (e.g., simultaneously) a and c, both (e.g., simultaneously) b and c, all of a, b, and c, or variations thereof.

As the present disclosure allows for one or more suitable changes and numerous embodiments, particular embodiments will be illustrated in the drawings and described in more detail in the written description. Effects and features of the present disclosure and methods of achieving the same will be apparent with reference to embodiments and drawings described below in more detail. The present disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description may not be repeated.

In the following embodiments, while such terms as "first," "second," etc., may be used to describe one or more suitable elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. For example, intervening layers, regions, or components may be present.

Sizes of components in the drawings may be exaggerated for convenience of explanation. For example, because sizes and thicknesses of components in the drawings are arbitrarily illustrated for convenience of explanation, the following embodiments are not limited thereto.

The x, y, and z axes are not limited to three axes on the orthogonal coordinates system, and may be interpreted in a broad sense including the same. For example, the x-axis, the y-axis, and the z-axis may be perpendicular or normal to one another, or may represent different directions that are not perpendicular or normal to one another.

When a certain embodiment may be implemented differently, a specific process order may be performed differently from the described order. For example, two consecutively described processes may be performed substantially at the same time or performed in an order opposite to the described order.

Figure 2:
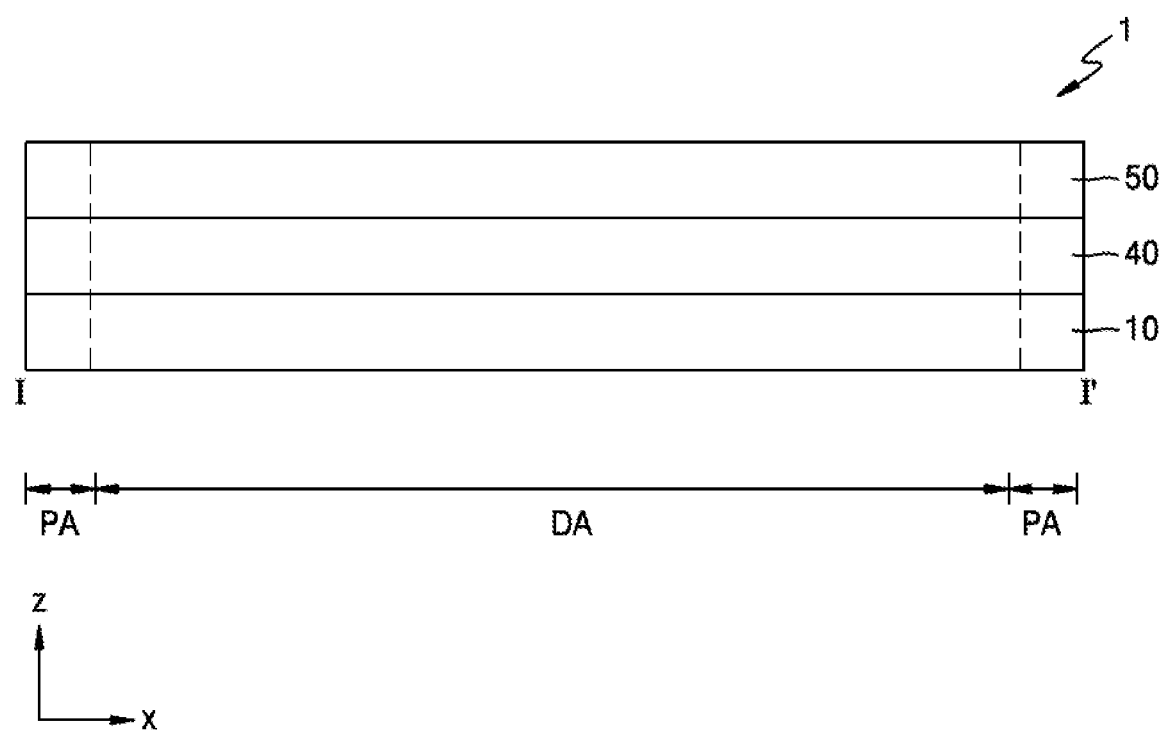
FIG. 2 is a schematic cross-sectional view of a display device according to an embodiment.

FIG. 1 is a schematic perspective view of a display device 1 according to an embodiment. FIG. 2 is a schematic cross-sectional view of the display device 1 taken along line I-I' of FIG. 1, according to an embodiment.

Referring to FIGS. 1 and 2, the display device 1 according to embodiments of the present disclosure may be implemented as an electronic device, such as a smartphone, a mobile phone, a smart watch, a navigation device, a game machine, a television (TV), an automotive head unit, a notebook computer, a laptop computer, a tablet computer, a personal media player (PMP), a personal digital assistant (PDA), and/or the like. In some embodiments, the electronic device may be a flexible device.

The display device 1 may include a display area DA in which an image is displayed, and a peripheral area PA around the display area DA. The display device 1 may provide an image by utilizing light emitted from a plurality of pixels arranged in the display area DA.

The display device 1 may have one or more suitable shapes, for example, a rectangular plate shape having two pairs of sides respectively parallel (substantially parallel) to each other. When the display device 1 has a rectangular plate shape, one pair of sides among two pairs of sides thereof may be longer than the other pair of sides. In an embodiment of the present disclosure, for convenience of explanation, an embodiment in which the display device 1 has a rectangular shape having a pair of long sides and a pair of short sides is shown, wherein an extension direction of the pair of short sides is indicated as a first direction (x direction or x-axis direction), an extension direction of the pair of long sides is indicated as a second direction (y direction or y-axis direction), and a direction perpendicular or normal to the pair of long sides and the pair of short sides is indicated as a third direction (z direction or z-axis direction). In another embodiment, the display device 1 may have a non-rectangular shape. The non-rectangular shape may include, for example, a circular shape, an elliptical shape, a partially circular polygonal shape, or a polygonal shape other than a rectangular shape.

In a plan view of the display area DA, the display area DA may have a rectangular shape, as shown in FIG. 1. In another embodiment, the display area DA may have a polygonal shape such as a triangular shape, a pentagonal shape, a hexagonal shape, or the like, or a circular shape, an elliptical shape, an atypical shape, or the like.

The peripheral area PA is an area around the display area DA, and may be a type or kind of non-display area in which pixels are not arranged. The display area DA may be entirely surrounded by the peripheral area PA. Various lines configured to deliver electrical signals to be applied to components in the display area DA, as well as pads to which a printed circuit board or a driver integrated circuit (IC) chip is attached may be in the peripheral area PA.

Hereinafter, according to an embodiment, an organic light-emitting display device is described as an example of the display device 1. However, the display device 1 in the present disclosure is not limited thereto. In another embodiment, the display device 1 of the present disclosure may be a display device such as an inorganic light-emitting display device or an inorganic electroluminescence (EL) display device, or a quantum dot light-emitting display device.

Referring to FIG. 2, the display device 1 may include a display panel 10, an input sensing layer 40 on the display panel 10, and an optical functional layer 50.

The display panel 10 may display an image. The display panel 10 includes pixels in the display area DA. The pixels may include a display element. The display element may be connected to a pixel circuit. The display element may include an organic light-emitting diode, such as a quantum dot organic light-emitting diode, and/or the like.

The input sensing layer 40 may obtain coordinate information according to an external input, for example, a touch event. The input sensing layer 40 may include a sensing electrode (or touch electrode) and a trace line connected to the sensing electrode. The input sensing layer 40 may be on the display panel 10. The input sensing layer 40 may sense an external input in a mutual-cap method and/or a self-cap method.

The input sensing layer 40 may be formed directly on the display panel 10, or may be formed separately and then bonded to the display panel 10 through an adhesive layer such as an optical clear adhesive. For example, the input sensing layer 40 may be continuously formed after an operation of forming the display panel 10, and in this embodiment, the input sensing layer 40 may be a portion of the display panel 10, and the adhesive layer may not be between the input sensing layer 40 and the display panel 10. FIG. 2 illustrates that the input sensing layer 40 is between the display panel 10 and the optical functional layer 50, but the input sensing layer 40 may be on the optical functional layer 50 in another embodiment.

The optical functional layer 50 may include a color converting layer and an anti-reflection layer. The color converting layer may convert light emitted from the display panel 10 into light of a certain wavelength band. The color converting layer may include a quantum dot layer, a transparent layer, and a bank layer. The bank layer is a layer that blocks (reduces) light, and may be in a form in which a dye and/or the like is included in a resin. The anti-reflection layer may reduce reflectance of light (external light) incident from the outside toward the display panel 10. The anti-reflection layer may include a black matrix and/or color filters. The color filters may be arranged by considering a color of light emitted from each of the pixels of the display panel 10.

Figure 3:
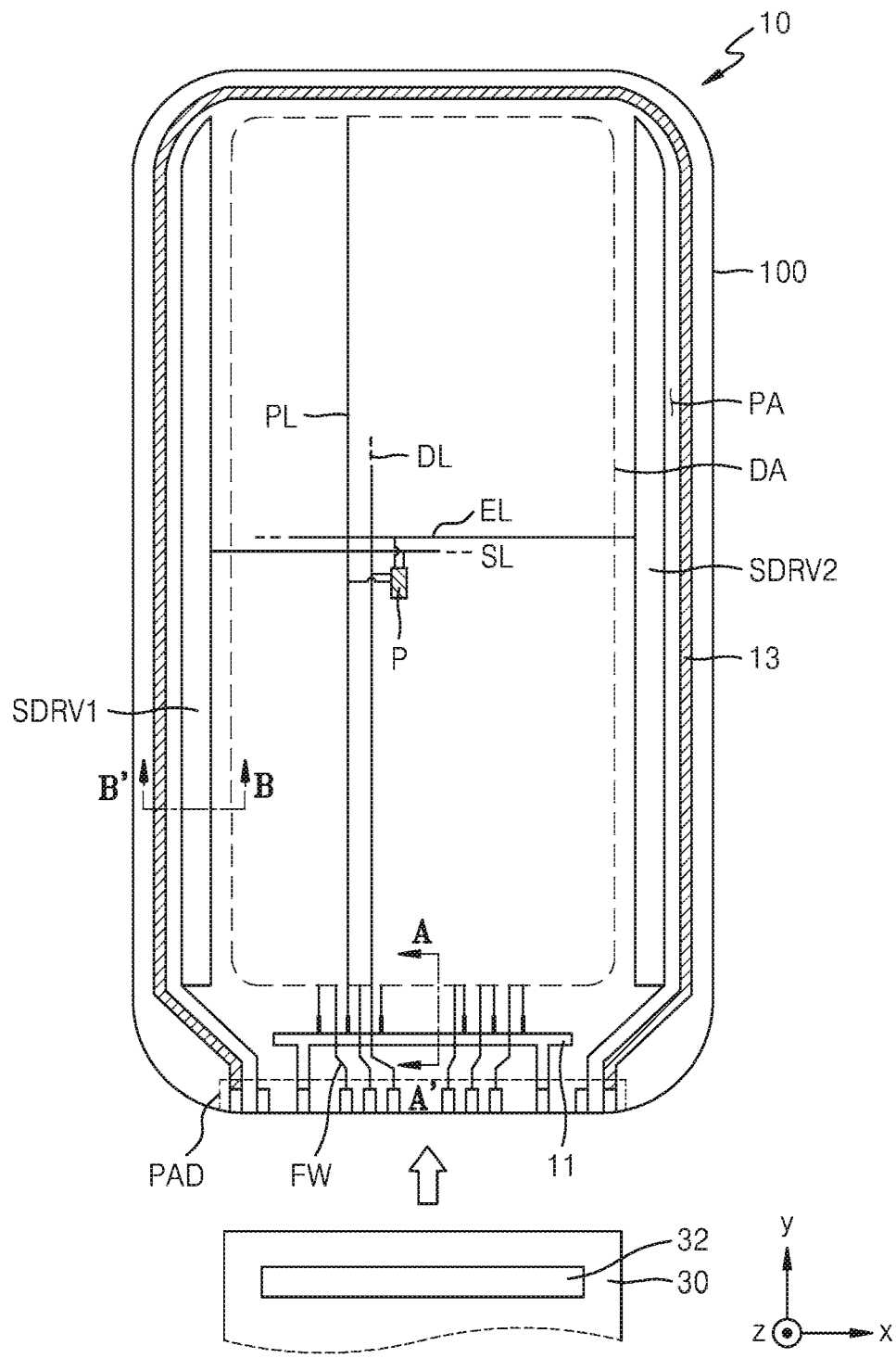
FIG. 3 is a schematic plan view of a display panel according to an embodiment.

FIG. 3 is a schematic plan view of the display panel 10 according to an embodiment.

Referring to FIG. 3, one or more suitable components forming the display panel 10 may be on a substrate 100. The substrate 100 includes the display area DA and the peripheral area PA around (e.g., surrounding) the display area DA.

In the display area DA, a plurality of pixels P and signal lines which may respectively apply electrically signals to the plurality of pixels P may be arranged. Each of the plurality of pixels P may be implemented as a display element such as an organic light-emitting diode. The pixel P may emit, for example, red, green, blue, or white light. The display area DA may be covered by an encapsulation member to be protected from external air or moisture.

The signal lines which may respectively apply electrical signals to the plurality of pixels P may include a plurality of scan lines SL and a plurality of data lines DL. Each of the plurality of scan lines SL may extend in a first direction (x direction), and each of the plurality of data lines DL may extend in a second direction (y direction). The plurality of scan lines SL, for example, may be arranged in a plurality of rows and configured to respectively transmit or provide scan signals to the plurality of pixels P, and the plurality of data lines DL, for example, may be arranged in a plurality of columns and configured to respectively transmit data signals to the plurality of pixels P. Each of the plurality of pixels P may be connected to at least one corresponding scan line SL among the plurality of scan lines SL and at least one corresponding data line DL among the plurality of data lines DL.

The signal lines may further include a plurality of driving voltage lines PL, a plurality of emission control lines EL, and/or the like. Each of the plurality of emission control lines EL may extend in the x direction, and each of the plurality of driving voltage lines PL may extend in the y direction. The plurality of emission control lines EL, for example, may be arranged in a plurality of rows and configured to respectively transmit or provide emission control signals to the plurality of pixels P. The plurality of driving voltage lines PL, for example, may be arranged in a plurality of columns and configured to respectively transmit or provide driving voltage signals (driving voltages) to the plurality of pixels P.

Each of pixel circuits forming the pixel P may be electrically connected to outer circuits in the peripheral area PA. The peripheral area PA is an area in which the plurality of pixels P are not arranged. In the peripheral area PA, one or more suitable electronic devices or printed circuit boards may be electrically attached to the components therein, and a voltage line for supplying power to drive the plurality of pixels P may be positioned. For example, a first scan driving circuit SDRV1, a second scan driving circuit SDRV2, a terminal unit PAD, and a power supply line may be arranged in the peripheral area PA. The power supply line may include a driving voltage supply line 11 and a common voltage supply line 13.

The first scan driving circuit SDRV1 may apply a scan signal to each of the pixel circuits driving the plurality of pixels P via the plurality of scan lines SL. The second scan driving circuit SDRV2 may apply an emission control signal to each pixel circuit via the plurality of emission control lines EL. The second scan driving circuit SDRV2 may be positioned on the opposite side to the first scan driving circuit SDRV1 with respect to the display area DA and may be substantially parallel to the first scan driving circuit SDRV1.

The terminal unit PAD may be on a side of the substrate 100. The terminal unit PAD is exposed without being covered by an insulating layer to be connected to a display circuit board 30. A display driving unit 32 may be in the display circuit board 30.

The display driving unit 32 may generate a control signal to be transmitted to the first scan driving circuit SDRV1 and the second scan driving circuit SDRV2. The display driving unit 32 may generate a data signal, and the generated data signal may be transmitted to the pixel circuits of the plurality of pixels P via fan-out lines FW and the plurality of data lines DL connected to the fan-out lines FW. The fan-out lines FW may extend in the y direction.

The display driving unit 32 may supply a driving voltage ELVDD (refer to FIG. 4) to the driving voltage supply line 11 and supply a common voltage ELVSS (refer to FIG. 4) to the common voltage supply line 13. The driving voltage ELVDD may be applied to the pixel circuits of the plurality of pixels P via the driving voltage line PL connected to the driving voltage supply line 11. The common voltage ELVSS may be applied to an opposite electrode of display elements via the common voltage supply line 13.

The driving voltage supply line 11 may be connected to the terminal unit PAD and extend in the x direction below the display area DA. The common voltage supply line 13 may be connected to the terminal unit PAD, have a loop shape with one side (e.g., a lower side of the display area DA) open, and partially surround (or be around) the display area DA. The common voltage supply line 13 may extend in the y direction on left and right sides of the display area DA, and may extend in the x direction above the display area DA.

Figure 4:
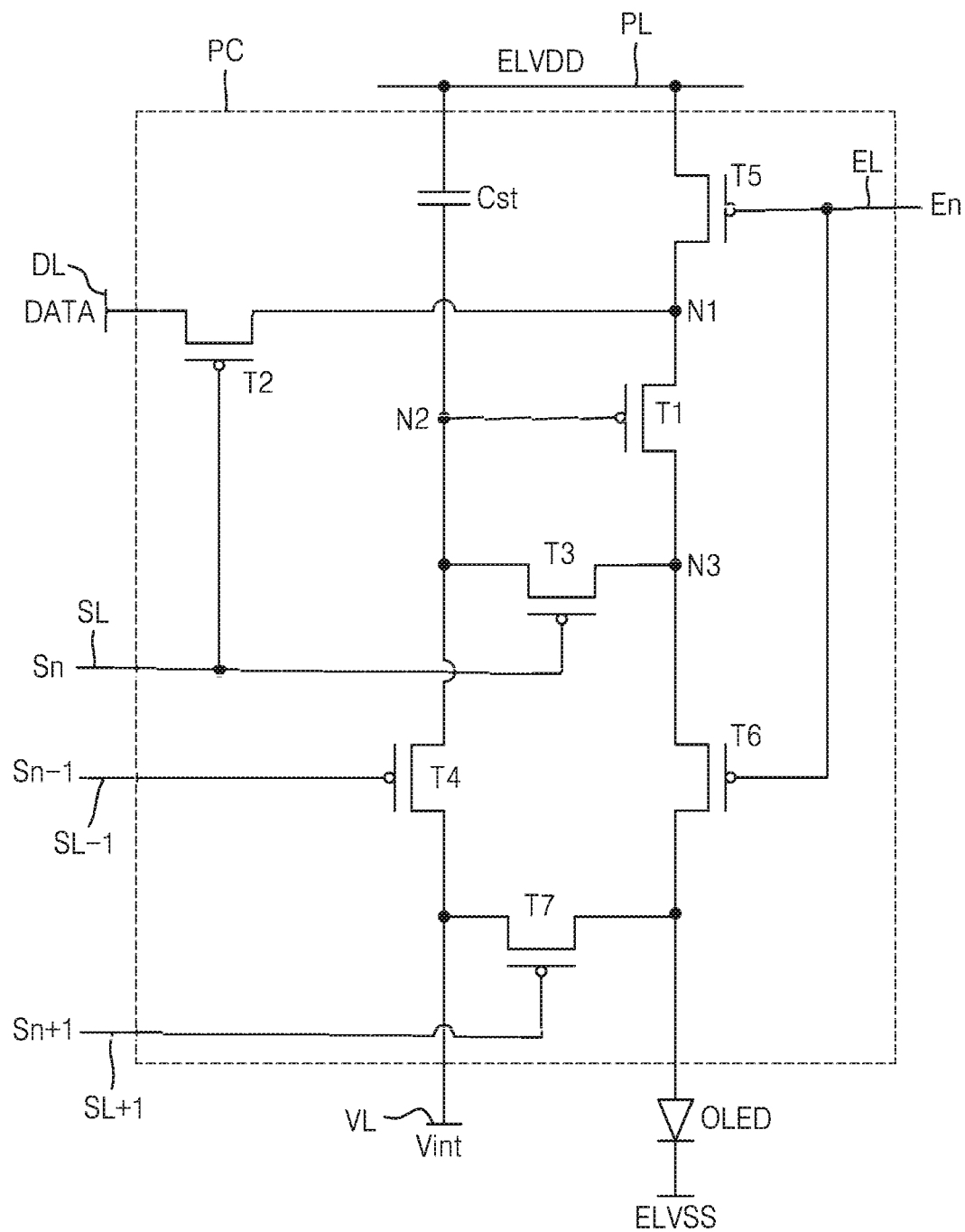
FIG. 4 is an equivalent circuit diagram of a pixel according to an embodiment.

FIG. 4 is an equivalent circuit diagram of a pixel according to an embodiment.

Referring to FIG. 4, a pixel circuit PC may include first to seventh transistors T1 to T7, and according to a transistor type or kind (P-type or kind or N-type or kind) and/or an operating condition, a first terminal of each of the first to seventh transistors T1 to T7 may be a source terminal or a drain terminal, and a second terminal thereof may be a terminal different from the first terminal. For example, when the first terminal is a source terminal, the second terminal may be a drain terminal.

The pixel circuit PC may be connected to a first scan line SL configured to transmit a first scan signal Sn, a second scan line SL−1 configured to transmit a second scan signal Sn−1, a third scan line SL+1 configured to transmit a third scan signal Sn+1, an emission control line EL configured to transmit an emission control signal En, a data line DL configured to transmit a data signal DATA, a driving voltage line PL configured to transmit a driving voltage ELVDD, and an initialization voltage line VL configured to transmit an initialization voltage Vint.

The first transistor T1 includes a gate terminal connected to a second node N2, a first terminal connected to a first node N1, and a second terminal connected to a third node N3. The first transistor T1 functions as a driving transistor and receives the data signal DATA according to a switching operation of the second transistor T2 to supply a driving current to a light-emitting element. The light-emitting element may be an organic light-emitting diode OLED.

The second transistor T2 (switching transistor) includes a gate terminal connected to the first scan line SL, a first terminal connected to the data line DL, and a second terminal connected to the first node N1 (or the first terminal of the first transistor T1). The second transistor T2 may be turned on according to the first scan signal Sn received through the first scan line SL and may perform a switching operation of delivering the data signal DATA delivered to the data line DL to the first node N1.

The third transistor T3 (compensation transistor) includes a gate terminal connected to the first scan line SL, a first terminal connected to the second node N2 (or the gate terminal of the first transistor T1), and a second terminal connected to the third node N3 (the second terminal of the first transistor T1). The third transistor T3 may be turned on according to the first scan signal Sn received via the first scan line SL to diode-connect the first transistor T1. The third transistor T3 may have a structure in which two or more transistors are connected in series.

The fourth transistor T4 (first initialization transistor) includes a gate terminal connected to the second scan line SL−1, a first terminal connected to the initialization voltage line VL, and a second terminal connected to the second node N2. The fourth transistor T4 may be turned on according to the second scan signal Sn−1 received through the second scan line SL−1 and configured to transmit the initialization voltage Vint to the gate terminal of the first transistor T1 to initialize a gate voltage of the first transistor T1. The fourth transistor T4 may have a structure in which two or more transistors are connected in series.

The fifth transistor T5 (first emission control transistor) includes a gate terminal connected to the emission control line EL, a first terminal connected to the driving voltage line PL, and a second terminal connected to the first node N1. The sixth transistor T6 (second emission control transistor) includes a gate terminal connected to the emission control line EL, a first terminal connected to the third node N3, and a second terminal connected to a pixel electrode of the organic light-emitting diode OLED. The fifth transistor T5 and the sixth transistor T6 are concurrently (e.g., simultaneously) turned on according to the emission control signal En received through the emission control line EL, so that current flows to the organic light-emitting diode OLED.

The seventh transistor T7 (second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on according to the third scan signal Sn+1 received through the third scan line SL+1 and configured to transmit the initialization voltage Vint to the pixel electrode of the organic light-emitting diode OLED to initialize a voltage of the pixel electrode of the organic light-emitting diode OLED. The seventh transistor T7 may not be provided.

A capacitor Cst includes a first electrode connected to the second node N2 and a second electrode connected to the driving voltage line PL.

The organic light-emitting diode OLED may include the pixel electrode and an opposite electrode facing the pixel electrode, and the opposite electrode may receive the common voltage ELVSS. The organic light-emitting diode OLED may receive a driving current from the first transistor T1 and emit light in a certain color to display an image. The opposite electrode may be provided in common in a plurality of pixels, for example, integrally.

FIG. 4 illustrates an embodiment in which the fourth transistor T4 and the seventh transistor T7 are respectively connected to the second scan line SL−1 and the third scan line SL+1, but the present disclosure is not limited thereto. In another embodiment, the fourth transistor T4 and the seventh transistor T7 may both (e.g., simultaneously) be connected to the second scan line SL−1 to be driven according to the second scan signal Sn−1.

Figure 5:
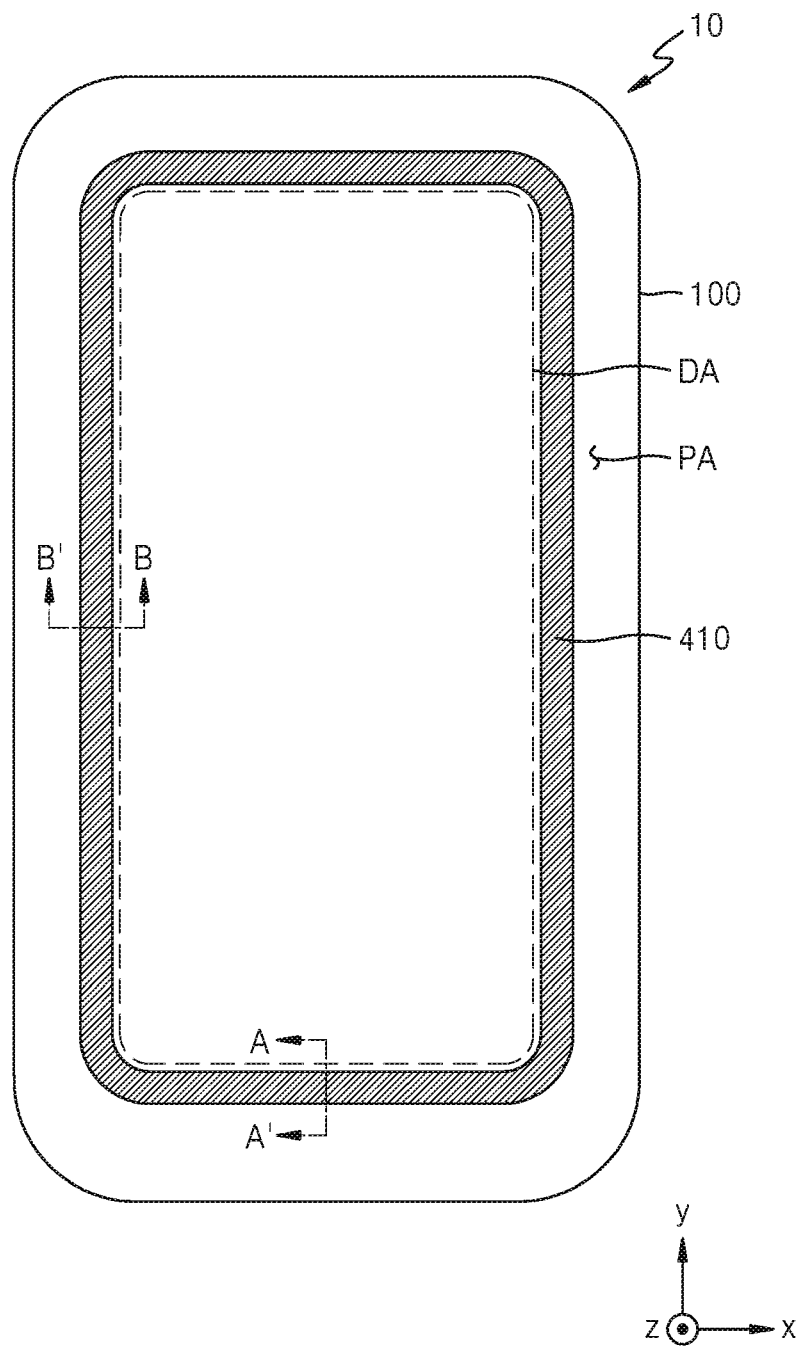
FIG. 5 is a schematic plan view of a portion of a bank protection layer and a display panel according to an embodiment.

FIG. 5 is a schematic plan view of a portion of a bank protection layer 410 and a display panel 10 according to an embodiment.

Referring to FIG. 5, the bank protection layer 410 may be on the display panel 10. The bank protection layer 410 may be arranged to surround (or be around) edges of the display area DA of the display panel 10. As the bank protection layer 410 forms a closed-loop, the display area DA may be inside the bank protection layer 410 in a plan view. In this embodiment, in a plan view, a linear distance from an inner edge of the bank protection layer 410 to an edge of the display area DA may be constant.

The bank protection layer 410 as described above may prevent or reduce a thin-film encapsulation layer from lifting caused by different pressures applied to a bank layer 400 (in FIGS. 6A to 7) when the bank layer 400 is polished.

A width (e.g., a linear distance between an outer edge and an inner edge of the bank protection layer 410 measured in an x-axis direction or a y-axis direction in FIG. 5) of the bank protection layer 410 may be the same throughout the bank protection layer 410. In another embodiment, the width of the bank protection layer 410 may be different throughout the bank protection layer 410. For example, a width of a short side of the bank protection layer 410, the short side being spaced apart from a short side of the display area DA, may be less than a width of a long side of the bank protection layer 410, the long side being spaced apart from a long side of the display area DA. Accordingly, even when a polishing device TOL (in FIG. 6A) applies a force for a long time to a long side portion of the display area DA during polishing, the bank protection layer 410 may effectively support and disperse the force applied by the polishing device TOL.

A planar shape of the bank protection layer 410 may be annular in one or more suitable forms. For example, the planar shape of the bank protection layer 410 may be a square donut shape as shown in FIG. 5. In another embodiment, the planar shape of the bank protection layer 410 may be a circular donut shape, although not illustrated in FIG. 5. In another embodiment, the planar shape of the bank protection layer 410 may be a polygonal donut shape or an elliptical donut shape.

Figure 6A:
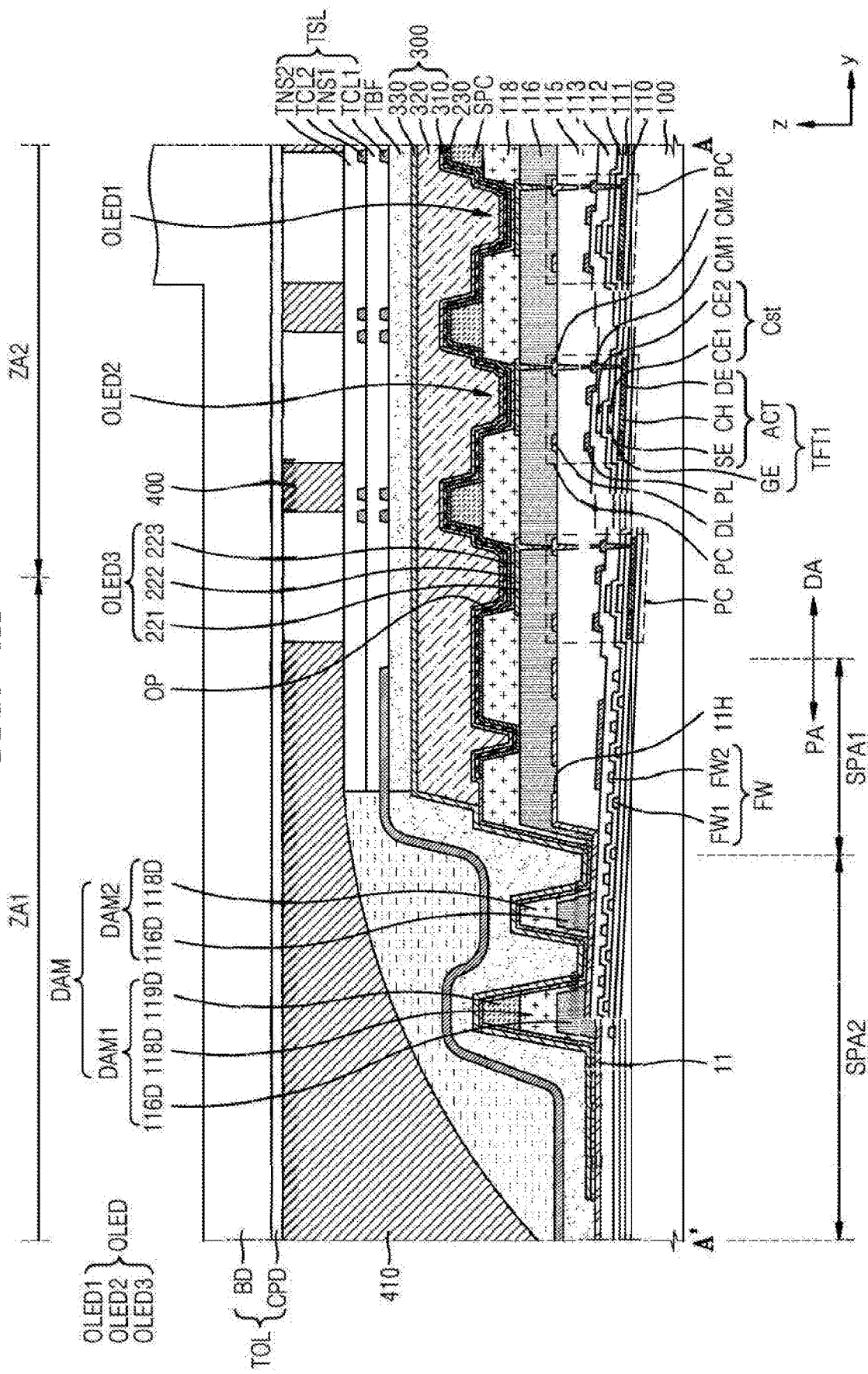
FIGS. 6A-6C are cross-sectional views of the display panel taken along line A-A' of FIG. 3, schematically illustrating a part of a method of manufacturing a display device.
Figure 6B:
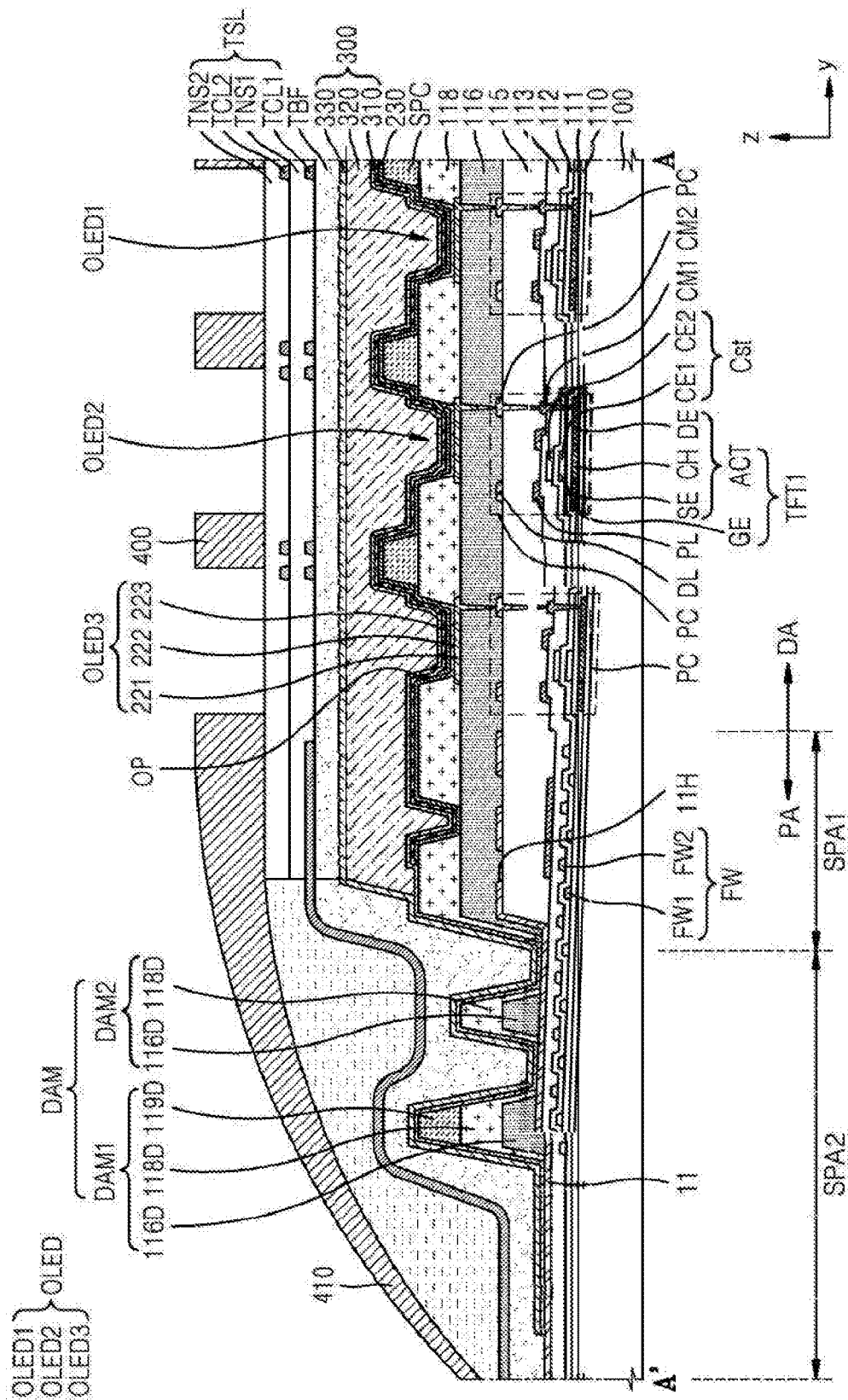
Figure 6C:
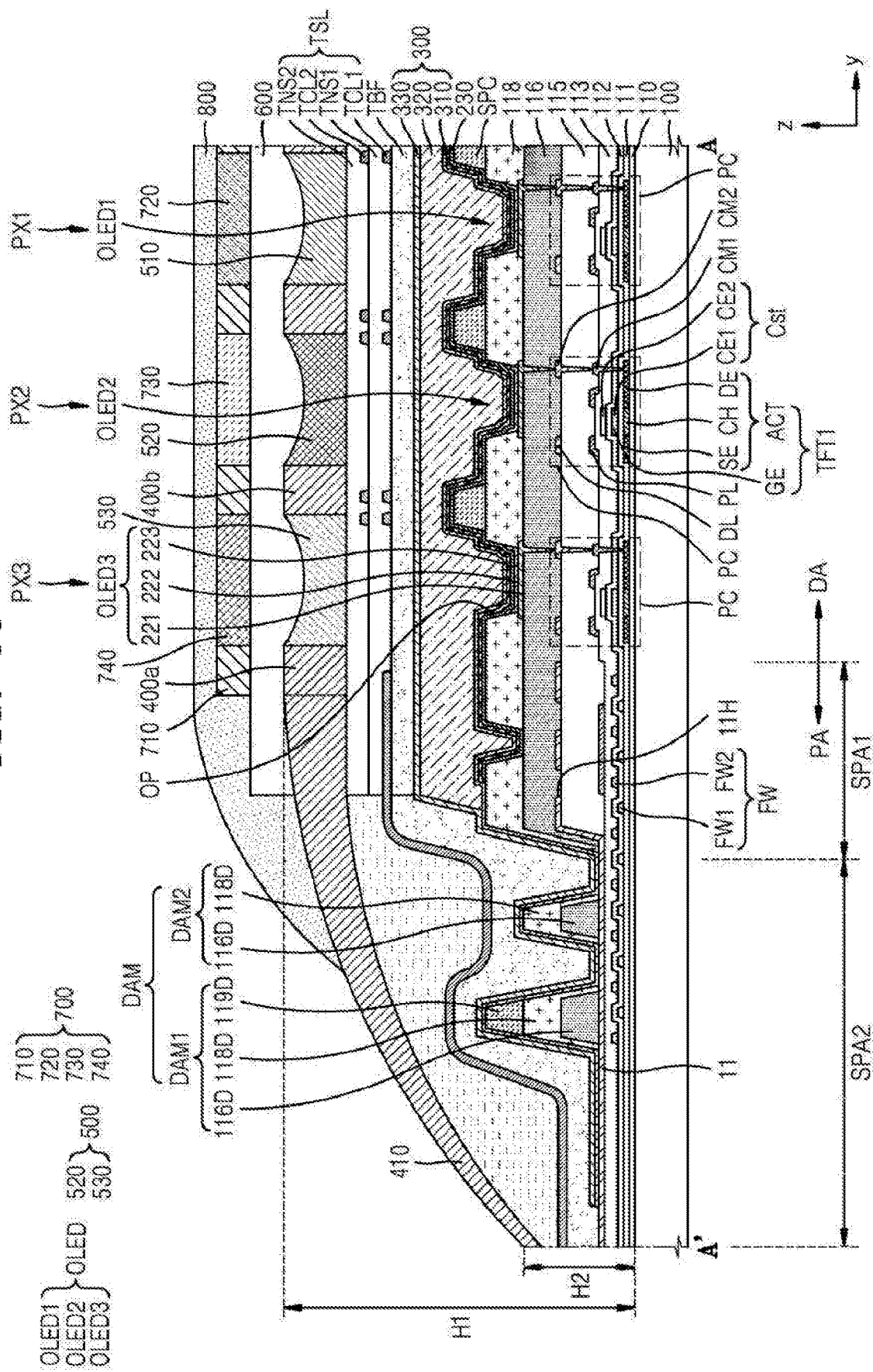
Figure 7:
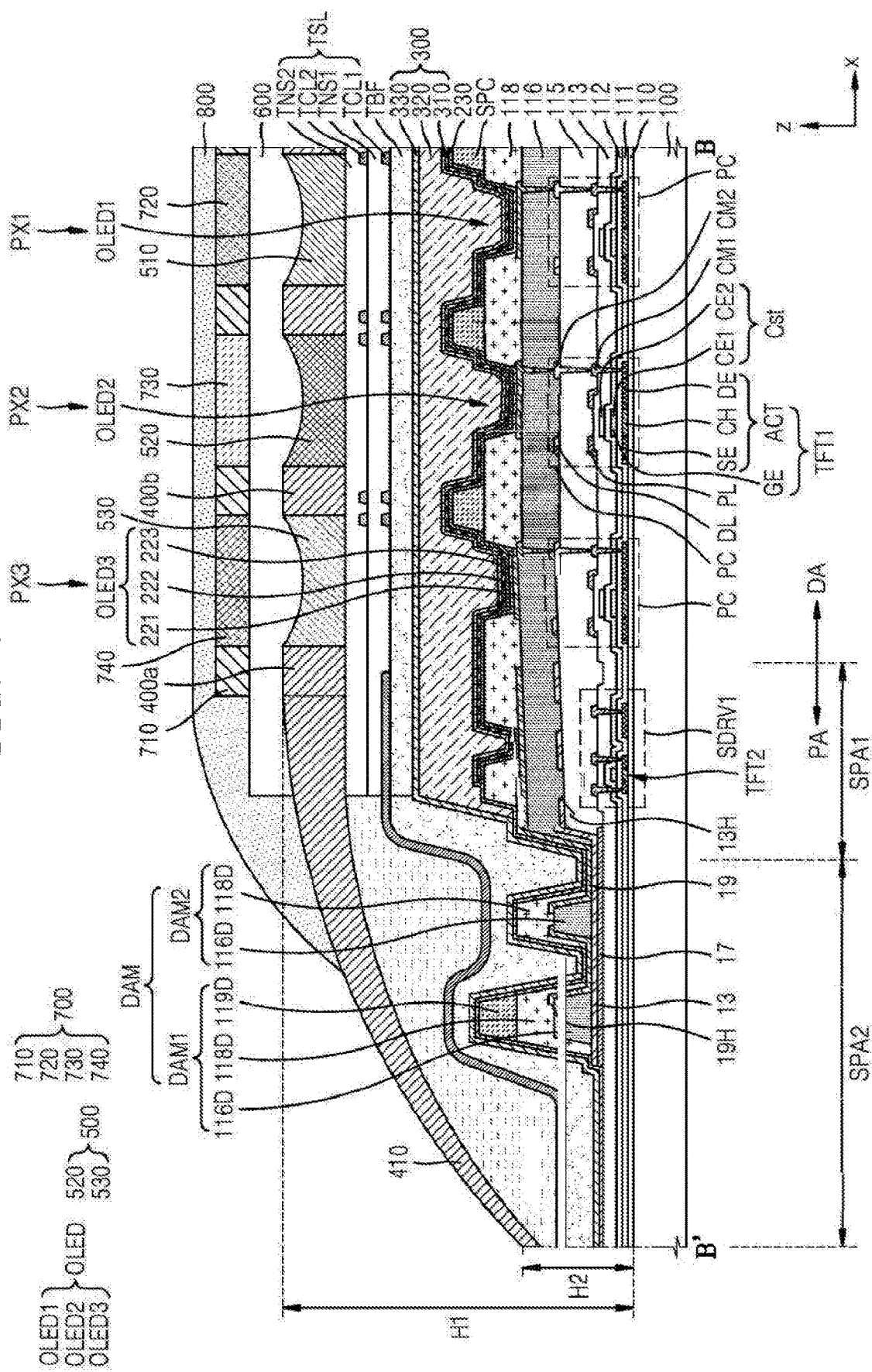
FIG. 7 is a cross-sectional view of the display panel taken along line B-B' of FIG. 3, schematically illustrating a portion of a display device.

FIGS. 6A to 6C are cross-sectional views of the display panel 10 taken along line A-A' of FIG. 3, schematically illustrating a method of manufacturing a portion of a display device. FIG. 7 is a cross-sectional view of the display panel 10 taken along line B-B' of FIG. 3, schematically illustrating a portion of a display device.

Referring to FIGS. 6A to 7, when manufacturing the display panel 10, one or more suitable layers may be sequentially formed on the substrate 100.

In particular, a pixel circuit PC and an organic light-emitting diode OLED electrically connected to the pixel circuit PC may be in the display area DA on the substrate 100. The pixel circuit PC may include a first thin-film transistor TFT1 and a capacitor Cst.

The substrate 100 may include one or more suitable materials such as a metal material or a plastic material. According to an embodiment, the substrate 100 may be a flexible substrate, and the substrate 100 may include a first base layer, a first barrier layer, a second base layer, and a second barrier layer, which are sequentially stacked. The first base layer and the second base layer may each include a polymer resin. For example, the first base layer and the second base layer may each include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate, cellulose triacetate (TAC), cellulose acetate propionate (CAP), and/or the like. The polymer resin may be transparent. Each of the first barrier layer and the second barrier layer is a layer that prevents (reduces) penetration of external foreign substances, and may be a single layer or a multilayer, each including an inorganic material such as silicon nitride and/or silicon oxide.

The buffer layer 110 may be on the substrate 100. The buffer layer 110 may block or reduce penetration of foreign substances and/or moisture through the substrate 100. The buffer layer 110 may include an inorganic material such as silicon oxide, silicon nitride, and/or silicon oxynitride, and may include a single layer or a multilayer.

The first thin-film transistor TFT1 may be one of the first to seventh transistors T1 to T7 described with reference to FIG. 4, for example, the first transistor T1, which is a driving transistor. The first thin-film transistor TFT1 may include a semiconductor layer ACT, and a gate electrode GE.

The semiconductor layer ACT may include amorphous silicon, polycrystalline silicon, an oxide semiconductor material, or an organic semiconductor material. The semiconductor layer ACT may include a channel area CH overlapping the gate electrode GE, and a source area SE and a drain area DE, the source area SE and the drain area DE being respectively on both sides of the channel area CH and including impurities. Here, the impurities may include an N-type or kind impurity or a P-type or kind impurity. The source area SE and the drain area DE may respectively be a source electrode and a drain electrode of the first thin-film transistor TFT1.

Considering the adhesion with adjacent layers, surface smoothness, and machinability of layers to be stacked, the gate electrode GE may include a single layer or a multilayer, each including, for example, at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). A first gate insulating layer 111 may be between the semiconductor layer ACT and the gate electrode GE.

The capacitor Cst includes a lower electrode CE1 and an upper electrode CE2 which overlap each other with a second gate insulating layer 112 therebetween. The capacitor Cst may overlap the first thin-film transistor TFT1. FIGS. 6A to 7 illustrate that the gate electrode GE of the first thin-film transistor TFT1 is the lower electrode CE1 of the capacitor Cst. In another embodiment, the capacitor Cst may not overlap the first thin-film transistor TFT1.

The first gate insulating layer 111 and the second gate insulating layer 112 may each include an inorganic insulating material such as silicon oxide, silicon nitride, silicon oxynitride, aluminum oxide, titanium oxide, tantalum oxide, hafnium oxide, and/or the like. The first gate insulating layer 111 and the second gate insulating layer 112 may each be a single layer or a multilayer, each including the above-mentioned material.

The upper electrode CE2 of the capacitor Cst may be covered by an interlayer insulating layer 113. The interlayer insulating layer 113 may include an inorganic insulating material such as silicon oxide, silicon nitride, silicon oxynitride, aluminum oxide, titanium oxide, tantalum oxide, hafnium oxide, and/or the like. The interlayer insulating layer 113 may be a single layer or a multilayer, each including the above-mentioned material.

A driving voltage line PL and a first connection electrode CM1 may be on the interlayer insulating layer 113. The driving voltage line PL and the first connection electrode CM1 may each include a single layer or a multilayer, each including at least one material of Al, Pt, Pd, Ag, Mg, Au, Ni, Nd, Ir, Cr, Li, Ca, Mo, Ti, W, and Cu. In an embodiment, the driving voltage line PL and the first connection electrode CM1 may each include a multilayer of Ti/Al/Ti.

A first insulating layer 115 may be on the driving voltage line PL and the first connection electrode CM1. A data line DL and a second connection electrode CM2 may be on the first insulating layer 115. The data line DL and the second connection electrode CM2 may each include the same material as that of the driving voltage line PL. For example, the data line DL and the second connection electrode CM2 may each include a single layer or a multilayer, each including at least one material of Al, Pt, Pd, Ag, Mg, Au, Ni, Nd, Ir, Cr, Li, Ca, Mo, Ti, W, and Cu. In an embodiment, the data line DL and the second connection electrode CM2 may each include a multilayer of Ti/Al/Ti. The data line DL and the second connection electrode CM2 may be covered by a second insulating layer 116. The data line DL may at least partially overlap the driving voltage line PL, as shown in FIGS. 6A to 7. In another embodiment, the data line DL may not overlap the driving voltage line PL.

In some embodiments of FIGS. 6A to 7, the data line DL is on an upper layer of the driving voltage line PL, but in other embodiments, the data line DL may be on the interlayer insulating layer 113, the driving voltage line PL may be on the first insulating layer 115, or the data line DL and the driving voltage line PL may be on the same layer. In another embodiment, the driving voltage line PL may also have a two-layer structure including a lower driving voltage line on the interlayer insulating layer 113 and an upper driving voltage line arranged on the first insulating layer 115 and electrically connected to the lower driving voltage line.

Each of the first insulating layer 115 and the second insulating layer 116 is a planarized insulating layer, and may be an organic insulating layer. For example, the first insulating layer 115 and the second insulating layer 116 may each include a commercial polymer such as poly(methyl methacrylate) (PMMA) or polystyrene (PS), a polymer derivative having a phenol group, and another organic insulating material such as an acrylic polymer, an imide polymer, a siloxane polymer, an aryl ether polymer, an amide polymer, a fluorine polymer, a p-xylene polymer, a vinyl alcohol polymer, and/or mixtures thereof. In an embodiment, the first insulating layer 115 and/or the second insulating layer 116 may be an organic insulating layer including polyimide and/or an organic insulating layer including siloxane.

Display elements, for example, organic light-emitting diodes OLED may be in the display area DA on the second insulating layer 116. The organic light-emitting diodes OLED may be arranged to be spaced apart from each other, and may include a first organic light-emitting diode OLED1, a second organic light-emitting diode OLED2, and a third organic light-emitting diode OLED3, which each may emit light of colors that are different from each other. The first organic light-emitting diode OLED1, the second organic light-emitting diode OLED2, and the third organic light-emitting diode OLED3 may emit different colors or same color of light. The first to third organic light-emitting diodes OLED1 to OLED3 may each include a pixel electrode 221, an intermediate layer 222, and/or an opposite electrode 223.

The pixel electrode 221 of each of the first to third organic light-emitting diodes OLED1 to OLED3 may be arranged on the second insulating layer 116 and connected to the first thin-film transistor TFT1 through the first connection electrode CM1 on the interlayer insulating layer 113 and the second connection electrode CM2 on the first insulating layer 115.

The pixel electrode 221 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 221 may include a reflective film, the reflective film including Ag, Mg, Al, Pt, Pd, Au, Ni, Nd, Ir, Cr, and/or one or more alloys and/or compounds thereof. In another embodiment, the pixel electrode 221 may further include a film including ITO, IZO, ZnO, or $In_2O_3$ above/below the reflective film mentioned above.

A third insulating layer 118 may be on the second insulating layer 116. The third insulating layer 118 may include an opening corresponding to a corresponding one of a plurality of pixels in the display area DA, for example, an opening OP through which a portion of the pixel electrode 221 is exposed. The third insulating layer 118 is a pixel defining layer, and the opening OP of the third insulating layer 118 may define an emission area of a pixel. The emission area may be an area in which an emission layer is arranged and light is emitted. For example, the third insulating layer 118 may be arranged to correspond to a remaining area except for the emission area, for example, a non-emission area. A size of the emission area may be different depending on the color of light emitted by a pixel.

In some embodiments, the third insulating layer 118 may prevent or reduce an arc and/or the like from being generated at an edge of the pixel electrode 221 by increasing a distance between the edge of the pixel electrode 221 and the opposite electrode 223 above the pixel electrode 221. The third insulating layer 118 may include an organic material such as polyimide (PI) and/or hexamethyldisiloxane (HMDSO).

The intermediate layer 222 includes an emission layer. The emission layer may include a polymer organic material and/or a low-molecular-weight organic material, which emits a certain color of light. In an embodiment, the intermediate layer 222 may include a first functional layer below the emission layer and/or a second functional layer above the emission layer. The first functional layer and/or the second functional layer may include an integrated layer over a plurality of pixel electrodes 221 or may include a patterned layer corresponding to each of the plurality of pixel electrodes 221.

The first functional layer may include a single layer or a multilayer. For example, when the first functional layer includes a polymer material, the first functional layer may be a hole transport layer having a single-layered structure, and may include poly-(3,4)-ethylene-dihydroxy thiophene (PEDOT) and/or polyaniline (PANI). When the first functional layer includes a low-molecular-weight material, the first functional layer may include a hole injection layer and a hole transport layer.

The second functional layer may not be provided. For example, when the first functional layer and the emission layer include a polymer material, the second functional layer is formed to improve the characteristics of an organic light-emitting diode. The second functional layer may include a single layer or a multilayer. The second functional layer may include an electron transport layer and/or an electron injection layer.

The opposite electrode 223 may be arranged to face the pixel electrode 221 with the intermediate layer 222 therebetween. The opposite electrode 223 may include a conductive material having a low work function. For example, the opposite electrode 223 may include a (semi)transparent layer, the (semi)transparent layer including Ag, Mg, Al, Pt, Pd, Au, Ni, Nd, Ir, Cr, Li, Ca, one or more alloys thereof, and/or the like. In some embodiments, the opposite electrode 223 may further include a layer such as ITO, IZO, ZnO, and/or $In_2O_3$ above the (semi)transparent layer including the above-mentioned material.

The opposite electrode 223 may be integrally formed in a plurality of organic light-emitting diodes OLED to face the plurality of pixel electrodes 221 and may be on the intermediate layer 222 and the third insulating layer 118.

A plurality of spacers SPC may be further arranged in the non-emission area of the display area DA. The plurality of spacers SPC may be around the plurality of pixel electrodes 221, for example, between the plurality of pixel electrodes 221. Each of the plurality of spacers SPC may be on the third insulating layer 118. The spacer SPC may include an island-shaped insulating pattern. The spacer SPC may have a polygonal shape such as a substantially square shape or a substantially triangular shape, a substantially circular shape, or a substantially oval shape. The spacer SPC may include an organic insulating material such as PI. In some embodiments, the spacer SPC may include an inorganic insulating material such as silicon nitride and/or silicon oxide, or may include an organic insulating material and an inorganic insulating material. The spacer SPC may include a material different from that of the third insulating layer 118. In some embodiments, the spacer SPC may include the same material as that of one of the first insulating layer 115, the second insulating layer 116, and the third insulating layer 118. The opposite electrode 223 may be on the spacer SPC.

A thin-film encapsulation layer 300 may be on the opposite electrode 223, so that the display panel 10 may be protected from foreign substances, moisture, and/or the like from the outside. The thin-film encapsulation layer 300 may include at least one organic encapsulation layer and at least one inorganic encapsulation layer. FIGS. 6A to 7 illustrate that the thin-film encapsulation layer 300 includes first and second inorganic encapsulation layers 310 and 330 and an organic encapsulation layer 320 therebetween. In another embodiment, the number of organic encapsulation layers, the number of inorganic encapsulation layers, and a stacking order thereof may be changed.

When necessary, a plurality of layers including a capping layer 230 may be between the first inorganic encapsulation layer 310 and the opposite electrode 223. FIGS. 6A to 7 illustrate that the capping layer 230 is included, but in another embodiment, the capping layer 230 may not be provided.

The first and second inorganic encapsulation layers 310 and 330 may each include at least one inorganic insulating material such as aluminum oxide, titanium oxide, tantalum oxide, hafnium oxide, zinc oxide, silicon oxide, silicon nitride, silicon oxynitride, and/or the like. The organic encapsulation layer 320 may include PET, PEN, polycarbonate, PI, polyethylene sulfonate, polyoxymethylene, PAR, HMDSO, an acrylic resin (e.g., PMMA, polyacrylic acid, etc.), or one or more combinations thereof. Because the first inorganic encapsulation layer 310 is formed along an underlying structure, an upper surface thereof may not be flat. The organic encapsulation layer 320 may have a sufficient thickness to cover the first inorganic encapsulation layer 310. An upper surface of the organic encapsulation layer 320 may be substantially flat. The second inorganic encapsulation layer 330 may extend outside the organic encapsulation layer 320 to make contact with the first inorganic encapsulation layer 310, so that the organic encapsulation layer 320 may be prevented or reduced from being exposed to the outside.

The peripheral area PA is described below. The peripheral area PA of FIGS. 6A to 6C may correspond to a portion below the display area DA shown in FIG. 3, and the peripheral area PA of FIG. 7 may correspond to a portion on the left or right side of the display area DA shown in FIG. 3. The peripheral area PA may include a first sub-peripheral area SPA1 adjacent to the display area DA (e.g., adjacent relative to other areas), and a second sub-peripheral area SPA2 adjacent to an edge of the substrate 100 outside the first sub-peripheral area SPA1 (e.g., adjacent relative to other areas). The first insulating layer 115, the second insulating layer 116, and the third insulating layer 118 may extend from the display area DA to the first sub-peripheral area SPA1. The second sub-peripheral area SPA2 may be a type or kind of dam area in which at least one dam unit DAM is arranged. FIGS. 6A to 7 illustrate two dam units DAM.

Referring to FIGS. 6A to 6C, as shown in FIG. 3, the driving voltage supply line 11 may be arranged in the peripheral area PA below the display area DA. The driving voltage supply line 11 may be in the first sub-peripheral area SPA1 and the second sub-peripheral area SPA2. The driving voltage supply line 11 may be between the first insulating layer 115 and the second insulating layer 116 in the first sub-peripheral area SPA1, and may be on the interlayer insulating layer 113 in the second sub-peripheral area SPA2.

A plurality of holes 11H may be defined in the driving voltage supply line 11 in the first sub-peripheral area SPA1. The plurality of holes 11H may function as outgassing passages for discharging gas generated by the first insulating layer 115 to the outside, and accordingly, a problem in which gas or moisture generated by the first insulating layer 115 penetrates into components in the display area DA and thus the quality of an image implemented in a display device is decreased may be prevented, minimized, or reduced. The driving voltage supply line 11 may include the same material as that of one of lines between the first insulating layer 115 and the second insulating layer 116 in the display area DA. For example, the driving voltage supply line 11 may include the same material as that of the data line DL on the first insulating layer 115 in the display area DA.

At least one line arranged between the interlayer insulating layer 113 and the first insulating layer 115 and overlapping the driving voltage supply line 11 may be further included in the first sub-peripheral area SPA1. The at least one line may include the same material as that of one of lines between the interlayer insulating layer 113 and the first insulating layer 115 in the display area DA. For example, the at least one line may include the same material as that of the driving voltage line PL on the interlayer insulating layer 113 in the display area DA.

A plurality of fan-out lines FW may be in the peripheral area PA below the display area DA as shown in FIG. 3. In an embodiment, as shown in FIGS. 6A to 6C, the plurality of fan-out lines FW may be arranged on different layers with at least one insulating layer therebetween. For example, a first fan-out line FW1 on the first gate insulating layer 111 and a second fan-out line FW2 on the second gate insulating layer 112 may be alternately arranged. Accordingly, an interval between adjacent fan-out lines FW may be reduced. In another embodiment, the plurality of fan-out lines FW may be arranged on the same layer. For example, the plurality of fan-out lines FW may be on the first gate insulating layer 111 and/or on the second gate insulating layer 112. The plurality of fan-out lines FW may be in the first sub-peripheral area SPA1 and the second sub-peripheral area SPA2.

The first scan driving circuit SDRV1 and the second scan driving circuit SDRV2 may be in the first sub-peripheral area SPA1. Referring to FIG. 7, the first scan driving circuit SDRV1 includes second thin-film transistors TFT2 and may include lines connected to the second thin-film transistor TFT2. The second thin-film transistors TFT2 may be formed in substantially the same operation as that of the first thin-film transistor TFT1 of the pixel circuit PC, and thus, a detailed description of the second thin-film transistors TFT2 may not be repeated here. A control signal line applying or providing a control signal to the first scan driving circuit SDRV1 may be further arranged in the first sub-peripheral area SPA1. The control signal line may include signal lines respectively applying a clock signal, an inverted clock signal, a carry signal, and/or the like. The control signal line may be on the same layer as the semiconductor layer ACT, the gate electrode GE, the upper electrode CE2 of the capacitor Cst, or the driving voltage line PL.

As shown in FIG. 3, the common voltage supply line 13 may be in the peripheral area PA on the left, right, and upper sides of the display area DA. The common voltage supply line 13 may be in the first sub-peripheral area SPA1 and the second sub-peripheral area SPA2. The common voltage supply line 13 may be between the first insulating layer 115 and the second insulating layer 116 in the first sub-peripheral area SPA1 and may be on the interlayer insulating layer 113 in the second sub-peripheral area SPA2.

A plurality of holes 13H may be defined in the common voltage supply line 13 in the first sub-peripheral area SPA1. The plurality of holes 13H may function as outgassing passages for discharging gas generated by the first insulating layer 115 to the outside, and accordingly, a problem in which gas or moisture generated by the first insulating layer 115 penetrates into components in the display area DA and thus the quality of an image implemented in a display device is decreased may be prevented, minimized, or reduced. The plurality of holes 13H may also be defined in an area adjacent to the display area DA in the common voltage supply line 13 above the substrate 100. The common voltage supply line 13 may include the same material as that of one of the lines between the first insulating layer 115 and the second insulating layer 116 in the display area DA. For example, the common voltage supply line 13 may include the same material as that of the data line DL on the first insulating layer 115 in the display area DA. The common voltage supply line 13 may be on the same layer as that of the driving voltage supply line 11, and may include the same material as that of the driving voltage supply line 11. The driving voltage supply line 11 and the common voltage supply line 13 may be provided on the same layer to be spaced apart from each other.

A voltage line 17 between the common voltage supply line 13 and the interlayer insulating layer 113 may be further arranged in the second sub-peripheral area SPA2. A portion of the common voltage supply line 13, the portion being in the second sub-peripheral area SPA2, may overlap the voltage line 17 and directly contact the voltage line 17. The voltage line 17 may include the same material as that of one of lines between the interlayer insulating layer 113 and the first insulating layer 115 in the display area DA. For example, the voltage line 17 may include the same material as that of the driving voltage line PL on the interlayer insulating layer 113 in the display area DA. The common voltage supply line 13 may be configured to transmit or provide the common voltage ELVSS applied from the voltage line 17 to the opposite electrode 223 via an auxiliary line 19.

The auxiliary line 19 may be in the first sub-peripheral area SPA1 and the second sub-peripheral area SPA2. The auxiliary line 19 may be on the second insulating layer 116 in the first sub-peripheral area SPA1 and on the common voltage supply line 13 in the second sub-peripheral area SPA2. A portion of the auxiliary line 19, the portion being in the first sub-peripheral area SPA1, may be connected to the opposite electrode 223. For example, the opposite electrode 223 may directly contact the auxiliary line 19 exposed by a hole defined in the third insulating layer 118 in the first sub-peripheral area SPA1. In the second sub-peripheral area SPA2, a portion of the auxiliary line 19 may overlap the common voltage supply line 13 and directly contact the common voltage supply line 13. In the second sub-peripheral area SPA2, a portion of the auxiliary line 19 may be between a plurality of layers forming a dam of the dam unit DAM. A hole 19H exposing a portion of an upper surface of a layer below the auxiliary line 19 may be defined in the auxiliary line 19 in the dam unit DAM. The auxiliary line 19 may include the same material as that of one of lines between the second insulating layer 116 and the third insulating layer 118 in the display area DA. For example, the auxiliary line 19 may include the same material as that of the pixel electrode 221 on the second insulating layer 116 in the display area DA.

The driving voltage supply line 11 and the common voltage supply line 13 may be above an inorganic layer. For example, the driving voltage supply line 11 and the common voltage supply line 13 may be above an inorganic insulating layer including at least one of the buffer layer 110, the first gate insulating layer 111, the second gate insulating layer 112, and the interlayer insulating layer 113.

When forming the organic encapsulation layer 320, it is necessary to limit a material for forming the organic encapsulation layer 320 to be positioned within a preset area. To accomplish this, the dam unit DAM including at least one dam may be provided in the peripheral area PA. The dam unit DAM may be provided in the form of a line around (e.g., surrounding) the display area DA, similar to the bank protection layer 410 shown in FIG. 5. The dam unit DAM may be below the bank protection layer 410. For example, when viewed in a plan view, the dam unit DAM may be between an outer edge of the bank protection layer 410 shown in FIG. 5 and an edge of the display area DA. FIGS. 6A to 7 illustrate two dams including first and second dams DAM1 and DAM2. The number of dams of the dam unit DAM may vary. The first and second dams DAM1 and DAM2 may be between the display area DA of the substrate 100 and the terminal unit PAD (refer to FIG. 3). The first and second dams DAM1 and DAM2 may be above an inorganic layer. For example, the first and second dams DAM1 and DAM2 may be above an inorganic insulating layer including at least one of the buffer layer 110, the first gate insulating layer 111, the second gate insulating layer 112, and the interlayer insulating layer 113.

The first dam DAM1 may be in the second sub-peripheral area SPA2. In the second sub-peripheral area SPA2, the second dam DAM2 which is closer (e.g., relatively closer) to the display area DA than the first dam DAM1 may be further provided between the first dam DAM1 and the first sub-peripheral area SPA1.

The first inorganic encapsulation layer 310 and the second inorganic encapsulation layer 330 may cover the first and second dams DAM1 and DAM2, and may be formed to the outside of the first and second dams DAM1 and DAM2. A position of the organic encapsulation layer 320 may be limited by the first and second dams DAM1 and DAM2, so that overflow of the material for forming the organic encapsulation layer 320 to the outside of the first and second dams DAM1 and DAM2 may be prevented or reduced.

At least a portion of the first and second dams DAM1 and DAM2 may be on power supply lines, for example, the driving voltage supply line 11 and/or the common voltage supply line 13. The first and second dams DAM1 and DAM2 may extend in an x direction on a lower side of the display area DA in the second sub-peripheral area SPA2. The first and second dams DAM1 and DAM2 may extend in a y direction on the left and right sides of the display area DA in the second sub-peripheral area SPA2. The first and second dams DAM1 and DAM2 may extend in the x direction on an upper side of the display area DA in the second sub-peripheral area SPA2.

Each of the plurality of dam units DAM may have a multi-layered structure including a plurality of layers. It is in one embodiment that a height of the first dam DAM1 at an outermost side is greater (e.g., relatively greater) than that of the second dam DAM2, such that the dam unit DAM functions to limit a position of the material for forming the organic encapsulation layer 320. A greater number of layers may be included in the first dam DAM1 so that the height of the first dam DAM1 at the outermost side from the display area DA is greater than that of the second dam DAM2. For example, the second dam DAM2 may include two layers, including a first layer 116D as a lowest layer and a second layer 118D on the first layer 116D, wherein the first layer 116D and the second layer 118D are stacked in a direction away from an upper surface of the substrate 100, for example, in a z direction. The first dam DAM1 may include three layers, including the first layer 116D as the lowest layer, the second layer 118D on the first layer 116D, and a third layer 119D on the second layer 118D, which are stacked in the z direction.

Each of the plurality of dam units DAM may include a plurality of organic insulating layers. For example, the first layer 116D may be concurrently (e.g., simultaneously) formed when the second insulating layer 116 is formed in the display area DA, and may include the same material as that of the second insulating layer 116. The second layer 118D may be concurrently (e.g., simultaneously) formed when the third insulating layer 118 is formed in the display area DA, and may include the same material as that of the third insulating layer 118. The third layer 119D may be concurrently (e.g., simultaneously) formed when the spacer SPC is formed in the display area DA, and may include the same material as that of the spacer SPC.

As shown in FIG. 7, the auxiliary line 19 may be between the first layer 116D and the second layer 118D of each of the first and second dams DAM1 and DAM2 to cover the first layer 116D. A hole 19H exposing a portion of an upper surface of the first layer 116D may be defined in the auxiliary line 19. The hole 19H may function as an outgassing passage for discharging gas generated by the first layer 116D to the outside.

An input sensing layer (see 40 of FIG. 2) may be on the thin-film encapsulation layer 300. The input sensing layer 40 may include a touch sensing layer TSL. The touch sensing layer TSL may have a structure in which a first touch conductive layer TCL1, a first touch insulating layer TNS1, a second touch conductive layer TCL2, and a second touch insulating layer TNS2 are sequentially stacked. The input sensing layer 40 may further include a touch buffer layer TBF.

In some embodiments, the second touch conductive layer TCL2 may operate as a touch electrode sensing whether a contact is made, and the first touch conductive layer TCL1 may function as a connection unit connected to the second touch conductive layer TCL2, which is patterned, in one direction.

In some embodiments, the first touch conductive layer TCL1 and the second touch conductive layer TCL2 may both (e.g., simultaneously) operate as touch electrodes. For example, the first touch insulating layer TNS1 may include a via (e.g., a via hole) exposing an upper surface of the first touch conductive layer TCL1, and the first touch conductive layer TCL1 and the second touch conductive layer TCL2 may be connected through the via. As described above, as the first touch conductive layer TCL1 and the second touch conductive layer TCL2 are utilized, the resistance of the touch electrodes may be reduced to improve the response speed of the touch sensing layer TSL.

In some embodiments, the touch electrodes may be formed to have a mesh structure to allow light emitted from the organic light-emitting diodes OLED to pass through. Accordingly, the first touch conductive layer TCL1 and the second touch conductive layer TCL2 may not overlap emission areas of the organic light-emitting diodes OLED.

Each of the first touch conductive layer TCL1 and the second touch conductive layer TCL2 may include a single film or a multilayer film, each including a conductive material having good or suitable conductivity. For example, each of the first touch conductive layer TCL1 and the second touch conductive layer TCL2 may include a transparent conductive layer, and may include a single film or a multilayer film, each including a conductive material including Al, Cu, Mo, Ti, and/or the like. The transparent conductive layer may include a transparent conductive oxide such as ITO, IZO, indium tin zinc oxide (ITZO), and/or the like. In some embodiments, the transparent conductive layer may include a conductive polymer such as PEDOT, a metal nanowire, graphene, and/or the like. In some embodiments, the first touch conductive layer TCL1 may include Mo, and the second touch conductive layer TCL2 may have a stacked structure of Ti/Al/Ti.

The first touch conductive layer TCL1 or the second touch conductive layer TCL2 may be connected to a touch line extending to the peripheral area PA. The touch line may be connected to the terminal unit PAD shown in FIG. 3.

Each of the first touch insulating layer TNS1 and the second touch insulating layer TNS2 may include an inorganic material and/or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of an acrylic resin, a methacrylic resin, polyisoprene, a vinyl resin, an epoxy resin, a urethane resin, a cellulose resin, and a perylene resin.

The touch buffer layer TBF may be further provided between the thin-film encapsulation layer 300 and the touch sensing layer TSL. The touch buffer layer TBF may be directly formed on the thin-film encapsulation layer 300. The touch buffer layer TBF may be configured to prevent or reduce damage to the thin-film encapsulation layer 300 and block or reduce interference signals that may occur when the touch sensing layer TSL is driven. The touch buffer layer TBF may include an inorganic insulating material such as silicon oxide ($SiO_2$), silicon nitride ($SiN_x$), silicon oxynitride (SiON), and/or the like, and may include a single layer or a multilayer.

A quantum dot layer and a transparent layer in each pixel may be on the touch sensing layer TSL as described above. For example, a second-color quantum dot layer 520 is above the second organic light-emitting diode OLED2 in a second pixel PX2. For example, the second-color quantum dot layer 520 is above a second pixel electrode (the pixel electrode 221) of the second organic light-emitting diode OLED2 in the second pixel PX2. Accordingly, when viewed from a direction (z-axis direction) perpendicular or normal to the substrate 100 (e.g., in a plan view), the second-color quantum dot layer 520 overlaps the second pixel electrode (the pixel electrode 221). The second-color quantum dot layer 520 may convert light in a first wavelength band generated by the intermediate layer 222 on the second pixel electrode (the pixel electrode 221) into light in a second wavelength band.

A third-color quantum dot layer 530 is above the third organic light-emitting diode OLED3 in a third pixel PX3. For example, the third-color quantum dot layer 530 is above a third pixel electrode (the pixel electrode 221) of the third organic light-emitting diode OLED3 in the third pixel PX3.

Accordingly, when viewed from a direction (z-axis direction) perpendicular or normal to the substrate 100 (e.g., in a plan view), the third-color quantum dot layer 530 overlaps the third pixel electrode (the pixel electrode 221). The third-color quantum dot layer 530 may convert light in the second wavelength band generated by the intermediate layer 222 on the third pixel electrode (the pixel electrode 221) into light in a third wavelength band. The first wavelength band and the second wavelength band may be different from or the same as each other.

Each of the second-color quantum dot layer 520 and the third-color quantum dot layer 530 may have a shape in which quantum dots are dispersed in a resin. In some embodiments to be described below, and modifications thereof, a quantum dot refers to a crystal of a semiconductor compound, and may include any material capable of emitting light having one or more suitable emission wavelengths depending on the size of the crystal. A diameter of the quantum dot may be, for example, about (or approximately) 1 nm to about 10 nm.

The quantum dot may be synthesized by a wet chemical operation, an organometallic chemical vapor deposition operation, a molecular beam epitaxy operation, a similar operation, or the like. The wet chemical operation is a method of growing quantum dot particle crystals after mixing an organic solvent and a precursor material. In the embodiment of the wet chemical operation, when the quantum dot particle crystals grow, the organic solvent acts as a dispersant naturally coordinated on the surface of the quantum dot particle crystals and adjusts the growth of the quantum dot particle crystals, and thus, the wet chemical operation is easier than vapor deposition methods such as metal organic chemical vapor deposition (MOCVD) or molecular beam epitaxy (MBE). In some embodiments, the wet chemical operation is a low-cost operation and may control the growth of quantum dot particle crystals.

Such a quantum dot may include a Group II-VI semiconductor compound, a Group III-V semiconductor compound, a Group III-VI semiconductor compound, a Group semiconductor compound, a Group IV-VI semiconductor compound, a Group IV element or compound, or one or more combinations thereof.

Examples of the Group II-VI semiconductor compound may include a binary compound such as CdS, CdSe, CdTe, ZnS, ZnSe, ZnTe, ZnO, HgS, HgSe, HgTe, MgSe, MgS, and/or the like, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like, a quaternary compound such as CdZnSeS, CdZnSeTe, CdZnSTe, CdHgSeS, CdHgSeTe, CdHgSTe, HgZnSeS, HgZnSeTe, HgZnSTe, and/or the like, or one or more combinations thereof.

Examples of the Group III-V semiconductor compound may include a binary compound such as GaN, GaP, GaAs, GaSb, AlN, AlP, AlAs, AlSb, InN, InP, InAs, InSb, and/or the like, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like, a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, GaAlNP, and/or the like, or one or more combinations thereof. The Group III-V semiconductor compound may further include a Group II element. Examples of the Group III-V semiconductor compound further including a Group II element may include InZnP, InGaZnP, InAlZnP, and/or the like.

Examples of the Group III-VI semiconductor compound may include a binary compound such as GaS, GaSe, Ga$_2$Se$_3$, GaTe, InS, InSe, In$_2$Se$_3$, InTe, and/or the like, a ternary compound such as InGaS$_3$, InGaSe$_3$, and/or the like, or one or more combinations thereof.

Examples of the Group I-III-VI semiconductor compound may include a ternary compound such as AgInS, AgInS$_2$, CuInS, CuInS$_2$, CuGaO$_2$, AgGaO$_2$, AgAlO$_2$, and/or the like, or one or more combinations thereof.

Examples of the Group IV-VI semiconductor compound may include a binary compound such as SnS, SnSe, SnTe, PbS, PbSe, PbTe, and/or the like, a ternary compound such as SnSeS, SnSeTe, SnSTe, PbSeS, PbSeTe, PbSTe, SnPbS, SnPbSe, SnPbTe, and/or the like, a quaternary compound such as SnPbSSe, SnPbSeTe, SnPbSTe, and/or the like, or one or more combinations thereof.

Examples of the Group IV element or compound may include a single-element such as Si, Ge, and/or the like, a binary compound such as SiC, SiGe, and/or the like, or one or more combinations thereof.

Each element included in a multi-element compound such as a binary compound, a ternary compound, and a quaternary compound may exist in a particle in a substantially uniform concentration or in a non-substantially uniform concentration.

In some embodiments, the quantum dot may have a single structure or a core-shell double structure in which the concentration of each element included in the quantum dot is substantially uniform. For example, a material included in the core and a material included in the shell may be different from each other. The shell of the quantum dot may function as a protective layer preventing or reducing chemical modification of the core to maintain semiconductor characteristics and/or may function as a charging layer for imparting electrophoretic characteristics to the quantum dot. The shell may include a single layer or a multilayer. An interface between the core and the shell may have a concentration gradient where a concentration of elements in the shell decreases toward the center of the interface.

Examples of the shell of the quantum dot may include an oxide of a metal or a nonmetal, a semiconductor compound, a combination thereof, and/or the like. Examples of the metal or nonmetal oxide may include a binary compound such as SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, or NiO, and/or the like, a ternary compound such as MgAl$_2$O$_4$, CoFe$_2$O$_4$, NiFe$_2$O$_4$, CoMn$_2$O$_4$, and/or the like, or one or more combinations thereof. Examples of the semiconductor compound may include, as described above, the Group II-VI semiconductor compound, the Group III-V semiconductor compound, the Group III-VI semiconductor compound, the Group I-III-VI semiconductor compound, the Group IV-VI semiconductor compound, or one or more combinations thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

The quantum dot may have a full width of half maximum (FWHM) of an emission wavelength spectrum of about 45 nm or less, about 40 nm or less, or about 30 nm or less. Color purity and color reproducibility may be improved in the above range. In some embodiments, as light emitted through the quantum dot is emitted in all directions, a viewing angle of light may be improved.

In some embodiments, the form of the quantum dot may be in the form of a nanoparticle, a nanotube, a nanowire, a nanofiber, or a nanoplatelet, which is for example substantially spherical, pyramidal, multi-arm or cubic.

Because an energy band gap may be adjusted by adjusting the size of the quantum dot, light in one or more suitable wavelength bands may be obtained from an emission layer of the quantum dot. Accordingly, a light-emitting diode emitting light having different wavelengths may be implemented by utilizing quantum dots of different sizes. In particular, the size of the quantum dots may be selected such that red, green and/or blue light is emitted. In some embodiments, the size of the quantum dots may be configured to emit white light by combining one or more suitable colors of light.

The second-color quantum dot layer 520 and the third-color quantum dot layer 530 may also include a scattering body. Also, any suitable resin included in the second-color quantum dot layer 520 and the third-color quantum dot layer 530 may be utilized as long as it has excellent or suitable dispersion characteristics with respect to the scattering body and transmits light. For example, a polymer resin such as an acrylic resin, an imide resin, or an epoxy resin may be utilized as the resin included in the second-color quantum dot layer 520 and the third-color quantum dot layer 530.

The scattering body included in the second-color quantum dot layer 520 and the third-color quantum dot layer 530 may be a particle having a different refractive index from that of a transparent resin included in the second-color quantum dot layer 520 and the third-color quantum dot layer 530, for example, a light scattering body. The scattering body is not limited as long as it is a material capable of partially scattering transmitted light by forming an optical interface between the scattering body and the transparent resin, and may be, for example, a metal oxide particle or an organic particle. Examples of the metal oxide for scattering may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like, and examples of the organic material for scattering may include an acrylic resin, a urethane resin, and/or the like. The scattering body may scatter light in multiple directions irrespective of an angle of incidence without substantially converting a wavelength of incident light. Accordingly, the scattering body may improve the side surface visibility of the display device. In some embodiments, the scattering body included in the second-color quantum dot layer 520 and the third-color quantum dot layer 530 may increase light conversion efficiency by increasing a probability that incident light incident on the second-color quantum dot layer 520 and the third-color quantum dot layer 530 meets the quantum dots.

A first pixel PX1 emits light having a first wavelength generated by the intermediate layer 222 to the outside without wavelength conversion. Accordingly, the first pixel PX1 does not have a quantum dot layer. Therefore, the transparent layer 510 including a transparent resin is positioned on the first organic light-emitting diode OLED1 in the first pixel PX1. For example, the transparent layer 510 is positioned on a first pixel electrode (pixel electrode 221) of the first organic light-emitting diode OLED1 in the first pixel PX1. Accordingly, when viewed from the direction (z-axis direction) perpendicular or normal to the substrate 100 (e.g., in a plan view), the transparent layer 510 overlaps the first pixel electrode (pixel electrode 221).

The transparent layer 510 may also include a scattering body, and any suitable resin included in the transparent layer 510 may be utilized as long as it is a transparent material with excellent or suitable dispersion characteristics for the scattering body. For example, a polymer resin such as an acrylic resin, an imide resin, or an epoxy resin may be utilized as the resin included in the transparent layer 510.

The scattering body included in the transparent layer 510 may be a particle having a different refractive index from that of the transparent resin included in the transparent layer 510, for example, a light scattering particle. The scattering body is not limited as long as it is a material capable of partially scattering transmitted light by forming an optical interface between the scattering body and the transparent resin, and may be, for example, a metal oxide particle or an organic particle. Examples of the metal oxide for scattering may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like, and examples of the organic material for scattering may include an acrylic resin, a urethane resin, and/or the like. The scattering body may scatter light in multiple directions irrespective of an angle of incidence without substantially converting a wavelength of incident light (lambertian reflection). Accordingly, the scattering body may improve the side surface visibility of the display device.

The transparent layer 510, the second-color quantum dot layer 520, and the third-color quantum dot layer 530 are positioned to respectively correspond to the first pixel electrode (pixel electrode 221) of the first organic light-emitting diode OLED1, the second pixel electrode (pixel electrode 221) of the second organic light-emitting diode OLED2, and the third pixel electrode (pixel electrode 221) of the third organic light-emitting diode OLED3, as described above. To accomplish this, the bank layer 400 having opening areas (e.g., an opening defined between bank layers 400a and 400b) respectively corresponding to the first pixel electrode (pixel electrode 221) of the first organic light-emitting diode OLED1, the second pixel electrode (pixel electrode 221) of the second organic light-emitting diode OLED2, and the third pixel electrode (pixel electrode 221) of the third organic light-emitting diode OLED3 may be above the thin-film encapsulation layer 300. The opening areas of the bank layer 400 corresponding to each of the first pixel electrode (pixel electrode 221) of the first organic light-emitting diode OLED1, the second pixel electrode (pixel electrode 221) of the second organic light-emitting diode OLED2, and the third pixel electrode (pixel electrode 221) of the third organic light-emitting diode OLED3 refers to that the opening areas overlapping each of the first pixel electrode (pixel electrode 221) of the first organic light-emitting diode OLED1, the second pixel electrode (pixel electrode 221) of the second organic light-emitting diode OLED2, and the third pixel electrode (pixel electrode 221) of the third organic light-emitting diode OLED3 when viewed from the direction (z-axis direction) perpendicular or normal to the substrate 100 (e.g., in a plan view). The bank layer 400 may include one or more suitable materials, for example, an inorganic material such as silicon oxide, silicon nitride, silicon oxynitride, and/or the like. In another embodiment, the bank layer 400 may also include a photoresist material, and accordingly, the bank layer 400 may be easily formed through an operation such as exposure and development, and/or the like.

The bank protection layer 410 may include an inorganic material and/or an organic material. The bank protection layer 410 may include a material same as or different from that of the bank layer 400.

The bank protection layer 410 may include an inorganic material such as silicon oxide, silicon nitride, silicon oxynitride, and/or the like. In another embodiment, the bank protection layer 410 may include a photoresist material. In another embodiment, the bank layer 400 may include an organic material such as a glycol ether-based and/or acrylate monomer-based resin.

The bank protection layer 410 as described above may be concurrently (e.g., simultaneously) formed when the bank layer 400 is formed, or the bank protection layer 410 may be formed after the bank layer 400 is formed. Hereinafter, for convenience of explanation, an embodiment in which the bank protection layer 410 includes the same material as that of the bank layer 400, and the bank protection layer 410 is concurrently (e.g., simultaneously) formed when the bank layer 400 is formed is described in more detail.

A low-refractive index layer 600 is on the transparent layer 510, the second-color quantum dot layer 520, and the third-color quantum dot layer 530. For example, the low-refractive index layer 600 is on the transparent layer 510, the second-color quantum dot layer 520, and the third-color quantum dot layer 530 to correspond to each of the first organic light-emitting diode OLED1 of the first pixel PX1, the second organic light-emitting diode OLED2 of the second pixel PX2, and the third organic light-emitting diode OLED3 of the third pixel PX3. The low-refractive index layer 600 includes a matrix portion and a plurality of particles in the matrix portion.

A black matrix layer 710 may include a polymer material. The black matrix layer 710 may include at least one of an acrylic polymer, a silicone polymer, a urethane polymer, and an imide polymer. For example, the black matrix layer 710 may include any one polymer material selected from an acrylic polymer, a silicone polymer, a urethane polymer, and an imide polymer, or a combination of a plurality of polymer materials selected from the above-mentioned polymers. In some embodiments, the black matrix layer 710 may include at least one of a siloxane polymer, a silsesquioxane polymer, an acrylic polymer substituted with a fluorine atom, a silicone polymer substituted with a fluorine atom, a urethane polymer substituted with a fluorine atom, and an imide polymer substituted with a fluorine atom. The black matrix layer 710 may include siloxane, acryl, polyimide, urethane, or epoxy. The black matrix layer 710 may be formed by solidifying a polymer resin such as siloxane, acryl, polyimide, urethane, or epoxy in a high-temperature operation or an ultraviolet light treatment operation.

A plurality of particles in the low-refractive index layer 600 may be silica. When necessary, the plurality of particles in the low-refractive index layer 600 may have a coating layer including an inorganic material on surfaces thereof. The coating layer may include silicon oxide or magnetite ($Fe_3O_4$). In some embodiments, the plurality of particles in the low-refractive index layer 600 may also be substantially hollow particles in which internal portions thereof are filled with air. When the plurality of particles in the low-refractive index layer 600 are substantially hollow particles, the plurality of particles may include silicon oxide, acryl, polyimide, urethane, styrene, and/or epoxy. The refractive index of the plurality of particles in the low-refractive index layer 600 may be, for example, 1.1 or more and 1.3 or less. The refractive index of the plurality of particles of the low-refractive index layer 600 may be made to be 1.1 or more and 1.3 or less by adjusting and optimizing a refractive index of the low-refractive index layer 600 by setting an average diameter of the plurality of particles included in the low-refractive index layer 600 to 200 nm or more and 150 nm or less.

In another embodiment, a capping layer may be between a low-refractive index layer 600 and a quantum dot layer 500 and between the low-refractive index layer 600 and the transparent layer 510. The capping layer may have an integral shape to correspond to each of the first organic light-emitting diode OLED1 of the first pixel PX1, the second organic light-emitting diode OLED2 of the second pixel PX2, and the third organic light-emitting diode OLED3 of the third pixel PX3. The capping layer may include an inorganic material such as silicon oxide, silicon nitride, silicon oxynitride, and/or the like. However, hereinafter, for convenience of explanation, an embodiment in which a capping layer is not between the low-refractive index layer 600 and the quantum dot layer 500 and between the low-refractive index layer 600 and the transparent layer 510 is described in more detail.

A first-color color filter layer 720, a second-color color filter layer 730, and a third-color color filter layer 740 are on the low-refractive index layer 600. For example, the first-color color filter layer 720 is on the low-refractive index layer 600 to correspond to the first organic light-emitting diode OLED1 in the first pixel PX1, the second-color color filter layer 730 is on the low-refractive index layer 600 to correspond to the second organic light-emitting diode OLED2 of the second pixel PX2, and the third-color color filter layer 740 is on the low-refractive index layer 600 to correspond to the third organic light-emitting diode OLED3 of the third pixel PX3. For example, the first-color color filter layer 720 is on the first pixel electrode (pixel electrode 221) of the first organic light-emitting diode OLED1 in the first pixel PX1, the second-color color filter layer 730 is on the second pixel electrode (pixel electrode 221) of the second organic light-emitting diode OLED2 in the second pixel PX2, and the third-color color filter layer 740 is on the third pixel electrode (pixel electrode 221) of the third organic light-emitting diode OLED3 in the third pixel PX3. Accordingly, when viewed from the direction (z-axis direction) perpendicular or normal to the substrate 100 (e.g., in a plan view), the first-color color filter layer 720 overlaps the first pixel electrode (pixel electrode 221) of the first organic light-emitting diode OLED1, the second-color color filter layer 730 overlaps the second pixel electrode (pixel electrode 221) of the second organic light-emitting diode OLED2, and the third-color color filter layer 740 overlaps the third pixel electrode (pixel electrode 221) of the third organic light-emitting diode OLED3.

The first-color color filter layer 720 may only allow light having a wavelength in about 450 nm to about 495 nm to pass through, the second-color color filter layer 730 may only allow light having a wavelength in about 495 nm to about 570 nm to pass through, and the third-color color filter layer 740 may only allow light having a wavelength in about 630 nm to about 780 nm to pass through. The first-color color filter layer 720 to the third-color color filter layer 740 may each reduce external light reflection in the display device.

For example, when external light reaches the first-color color filter layer 720, only light having a preset wavelength as described above passes through the first-color color filter layer 720, and light having other wavelengths is absorbed by the first-color color filter layer 720. Accordingly, only the light having the preset wavelength as described above among the external light incident on the display device passes through the first-color color filter layer 720, and a portion of the light passing through the first-color color filter layer 720 is reflected by the opposite electrode 223 or the first pixel electrode (pixel electrode 221) thereunder and is emitted to the outside again. As a result, because only a portion of external light incident on a place where the first pixel PX1 is located is reflected to the outside, the first-color color filter layer 720 may reduce the external light reflection. The above descriptions may also be applied to the second-color color filter layer 730 and/or the third-color color filter layer 740.

When necessary, the black matrix layer 710 including carbon black and/or the like may be between the first-color color filter layer 720 to the third-color color filter layer 740. In this embodiment, similar to the bank layer 400, the black matrix layer 710 may be understood to have opening areas respectively corresponding to the first pixel electrode (pixel electrode 221) of the first organic light-emitting diode OLED1, the second pixel electrode (pixel electrode 221) of the second organic light-emitting diode OLED2, and the third pixel electrode (pixel electrode 221) of the third organic light-emitting diode OLED3. In some embodiments, the display device may not include (e.g., may exclude) the black matrix layer 710. In this embodiment, when viewed from the direction (z-axis direction) perpendicular or normal to the substrate 100 (e.g., in a plan view), in a portion between the first pixel PX1, the second pixel PX2, and the third pixel PX3, at least a portion of the first-color color filter layer 720 to the third-color color filter layer 740 may overlap each other.

An overcoat layer 800 on a color filter layer 700, which includes the black matrix layer 710, the first-color color filter layer 720, the second-color color filter layer 730, and the third-color color filter layer 740, may be further included.

The overcoat layer 800 may be a single layer or a multilayer, each including an inorganic material such as silicon nitride ($SiN_x$) and/or silicon oxide ($SiO_x$). In another embodiment, the overcoat layer 800 may include a transparent organic material such as a polyimide resin, an acrylic resin, a resist material, and/or the like. The overcoat layer 800 may be formed by a wet operation such as a slit coating method or a spin coating method, or a dry operation such as a chemical vapor deposition method and/or a vacuum deposition method. This embodiment is not limited to foregoing materials and formation methods.

In FIG. 4, the first to seventh transistors T1 to T7 of the pixel circuit PC are shown as P-type or kind transistors, but embodiments of the present disclosure are not limited thereto. For example, one or more suitable embodiments may be possible, for example, the first to seventh transistors T1 to T7 of the pixel circuit PC may be N-type or kind transistors, or some of which are P-type or kind transistors and others of which are N-type or kind transistors.

When viewing a method of manufacturing the display device as described above, a plurality of pixels PX1, PX2, and PX3 spaced apart from each other may be formed on a substrate 100 in a display area DA. In particular, as shown in FIG. 6A, the buffer layer 110 to the spacer SPC may be sequentially stacked on the substrate 100. The dam unit DAM may be concurrently (e.g., simultaneously) formed when each layer is formed. Thereafter, after the intermediate layer 222 arranged in each of the first to third pixels PX1, PX2, and PX3, the opposite electrode 223 may be sequentially formed.

In some embodiments, the first inorganic encapsulation layer 310, the organic encapsulation layer 320, and the second inorganic encapsulation layer 330 may be sequentially arranged on the opposite electrode 223. In some embodiments, the touch sensing layer TSL may be arranged on the second inorganic encapsulation layer 330.

When the above operation is completed, a plurality of bank layers 400 and the bank protection layer 410 may be formed on the second inorganic encapsulation layer 330 (or the touch sensing layer TSL). An upper surface of the bank protection layer 410 may be in a flat state as shown in FIG. 6A. The bank protection layer 410 as described above may be formed integrally with a bank layer 400, which is arranged at an outermost portion among the plurality of bank layers 400, or may be formed separately. Hereinafter, for convenience of explanation, an embodiment in which the bank layer 400, which is arranged at an outermost portion among the plurality of bank layers 400, and the bank protection layer 410 are integrally formed is described in more detail.

When the above operation is completed, the polishing device TOL is arranged on the plurality of bank layers 400 and the bank protection layer 410 to polish and partially remove upper portions of the plurality of bank layers 400 and the bank protection layer 410.

In particular, as shown in FIG. 6A, after arranging the polishing device TOL, the polishing device TOL may be operated. The polishing device TOL may include a body unit BD which rotates and a polishing pad CPD on the body unit BD. The body unit BD may not only rotate the polishing pad CPD but also press the polishing pad CPD in a −z-axis direction in FIG. 6A. In this embodiment, a cleaning liquid and/or the like may be supplied so that polishing is smoothly performed when the polishing pad CPD is rotated.

When the polishing device TOL operates as described above, the polishing device TOL may operate while moving along an entire area of the display device 1 shown in FIG. 1 or the display panel 10 shown in FIG. 3. In this embodiment, a pressure applied by the polishing pad CPD to the bank layer 400 arranged adjacent to an edge or corner portion of the display device 1 shown in FIG. 1 or the display panel 10 shown in FIG. 3 may be different from a pressure applied to the bank layers 400 arranged in other portions. When a portion of the polishing pad CPD is arranged at an outer portion of an edge or corner portion of the display device 1 shown in FIG. 1 or the display panel 10 shown in FIG. 3, and the other portion of the polishing pad CPD is arranged to contact an internal portion of the display device 1 shown in FIG. 1 or the display panel 10 shown in FIG. 3, the polishing pad CPD may apply an excessive force to the bank layer 400 arranged adjacent to the edge or corner portion of the display device 1 shown in FIG. 1 or the display panel 10 shown in FIG. 3. In this embodiment, the first inorganic encapsulation layer 310 and/or the second inorganic encapsulation layer 330 arranged in an edge portion of the display area DA may be separated from other layers. For example, as shown in FIG. 6A, when the bank protection layer 410 is not in a first area ZA1, an excessive force may be applied to the bank layer 400 in a second area ZA2. For example, the bank layer 400, which is arranged at an outermost portion among the bank layers 400 in the second area ZA2, is not applied with a vertical force from the top to the bottom of the bank layer 400, but may be applied with a force in a diagonal direction with respect to a height direction of the bank layer 400. In some embodiments, the force may not be only applied to the bank layer 400, as an angle formed with the height direction (e.g., the z-axis direction of FIG. 6A) of the bank layer 400 is variable, and magnitudes of the force applied to the bank layer 400 may also be different. However, when the bank protection layer 410 is arranged as described above, an area in which the polishing pad CPD is supported increases compared to that in the related art, and thus, a force applied by the polishing pad CPD to the bank layer 400 arranged at an outermost portion of the display area DA may be prevented or reduced from being excessive or may be prevented or reduced from being applied in a direction other than a direction perpendicular to an upper surface of the bank layer 400. In this embodiment, the bank protection layer 410 may extend from the edge of the display area DA to an area spaced apart by 3000 μm or more. For example, as shown in FIG. 6A, a length of an upper surface of a cross-section of the bank protection layer 410 in an x-axis direction may be 3000 μm or more. When the length of the upper surface of the cross-section of the bank protection layer 410 in the x-axis direction is less than 3000 μm, the thin-film encapsulation layer 300 may be separated from other layers or layers of the thin-film encapsulation layer 300 may be separated from each other by the force applied to the outermost bank layer 400 when polishing the bank layer 400.

In this regard, when a plurality of bank layers are formed in a display area of a substrate having a size of 18.2 inches and the bank protection layer 410 is not arranged, the plurality of bank layers may be polished with a polishing device. The dispersion of heights of the bank layers 400 at the edge portion of the display area DA may be 11.1%. Also, a difference between a height of the bank layer 400 adjacent to the edge of the display area DA and a height of the bank layer 400 adjacent to a center of the display area DA may be about 2 μm.

In contrast, when the plurality of bank layers 400 having the same size are arranged in the display area DA on the substrate 100, and the polishing device TOL is utilized after arranging the bank protection layer 410 at an outer portion of an edge of the display area DA, the dispersion of the heights of the plurality of bank layers 400 may be reduced to 5.7%. Also, a difference between a height of the bank layer 400 adjacent to the edge of the display area DA and a height of the bank layer 400 adjacent to the center of the display area DA may be about 0.5 μm.

Therefore, when the bank protection layer 410 is arranged, it may be confirmed that the heights of the bank layers 400 arranged at the outermost portion of the display area DA are constant after polishing even the polishing device TOL is utilized. Accordingly, it may be confirmed that a force applied by the polishing pad CPD to the plurality of bank layers 400 is maintained to some extent uniformly throughout the display area DA, and an excessive force is not applied to a portion adjacent to the edge portion of the display area DA.

When the above operation is completed, the upper surface of the bank protection layer 410 may have one or more suitable shapes. For example, the upper surface of the bank protection layer 410 may be flat as shown in FIG. 6A. A distance from a surface of the substrate 100 to the upper surface of the bank protection layer 410 may be less than an initial distance. In another embodiment, although not illustrated, the upper surface of the bank protection layer 410 may be formed in an oblique line. In another embodiment, the upper surface of the bank protection layer 410 may be formed to be substantially rounded as shown in FIGS. 6B and 6C. The upper surface of the bank protection layer 410 formed to be round may be a curved surface. For example, the bank protection layer 410 formed to be round may have an arc-shaped upper surface or a hemispherical upper surface. In another embodiment, the bank protection layer 410 may have an upper surface in a shape similar to a portion of an outer surface of a rugby ball.

After the polishing of the plurality of bank layers 400 and the bank protection layer 410 is completed as described above, droplets including quantum dots or droplets to form a transparent layer may be supplied between the bank layers 400 adjacent to each other. The droplets including the quantum dot and the droplets to form the transparent layer may be supplied to correspond to each pixel. These droplets may be supplied between the bank layers 400 adjacent to each other by an inkjet printing method.

The second-color quantum dot layer 520, the third-color quantum dot layer 530, and the transparent layer 510 may be formed by supplying the droplets. Then, the low-refractive index layer 600 may be formed on the second-color quantum dot layer 520, the third-color quantum dot layer 530, and the transparent layer 510, and the bank layer 400.

After forming the black matrix layer 710 on the low-refractive index layer 600 to correspond to the bank layers 400, the first-color color filter layer 720, the second-color color filter layer 730, and the third-color color filter layer 740 may be formed between the black matrix layers 710 adjacent to each other. The first-color color filter layer 720, the second-color color filter layer 730, and the third-color color filter layer 740 may also be arranged adjacent to each other without forming the black matrix layer 710. When the above operation is completed, the overcoat layer 800 may be formed on the first-color color filter layer 720, the second-color color filter layer 730, the third-color color filter layer 740, and the black matrix layer 710.

A height of the bank protection layer 410 formed as described above may be different in one direction (e.g., an y-axis direction of FIG. 6C and an x-axis direction of FIG. 7). For example, a first distance H1 from one surface of the substrate 100 to an upper surface of one portion of the bank protection layer 410 may be different from a second distance H2 from the one surface of the substrate 100 to the other portion of the bank protection layer 410. The one portion of the bank protection layer 410 may be closer to the display area DA than the other portion of the bank protection layer 410. In this embodiment, the first distance H1 may be greater than the second distance H2. In some embodiments, a linear distance from the one surface of the substrate 100 to the upper surface of the bank protection layer 410 may decrease as a distance from the display area DA increases.

In this embodiment, not only the dam unit DAM is arranged below the bank protection layer 410, but also an end of the first inorganic encapsulation layer 310 and an end of the second inorganic encapsulation layer 330 may be arranged. Accordingly, the bank protection layer 410 may prevent or reduce moisture and oxygen from penetrating into the organic light-emitting diodes OLED by completely shielding the end of the first inorganic encapsulation layer 310 and the end of the second inorganic encapsulation layer 330.

In another embodiment, the bank layer 400, the second-color quantum dot layer 520, the third-color quantum dot layer 530, and the transparent layer 510 may be arranged on the thin-film encapsulation layer 300 without including the touch sensing layer TSL. The touch buffer layer TBF is shown in FIGS. 6B and 6C to shield the dam unit DAM and an end of the thin-film encapsulation layer 300, however in another embodiment in which the touch sensing layer TSL is not included, there may be a structure in which the bank protection layer 410 shields the dam unit DAM and the end of the thin-film encapsulation layer 300.

Figure 8:
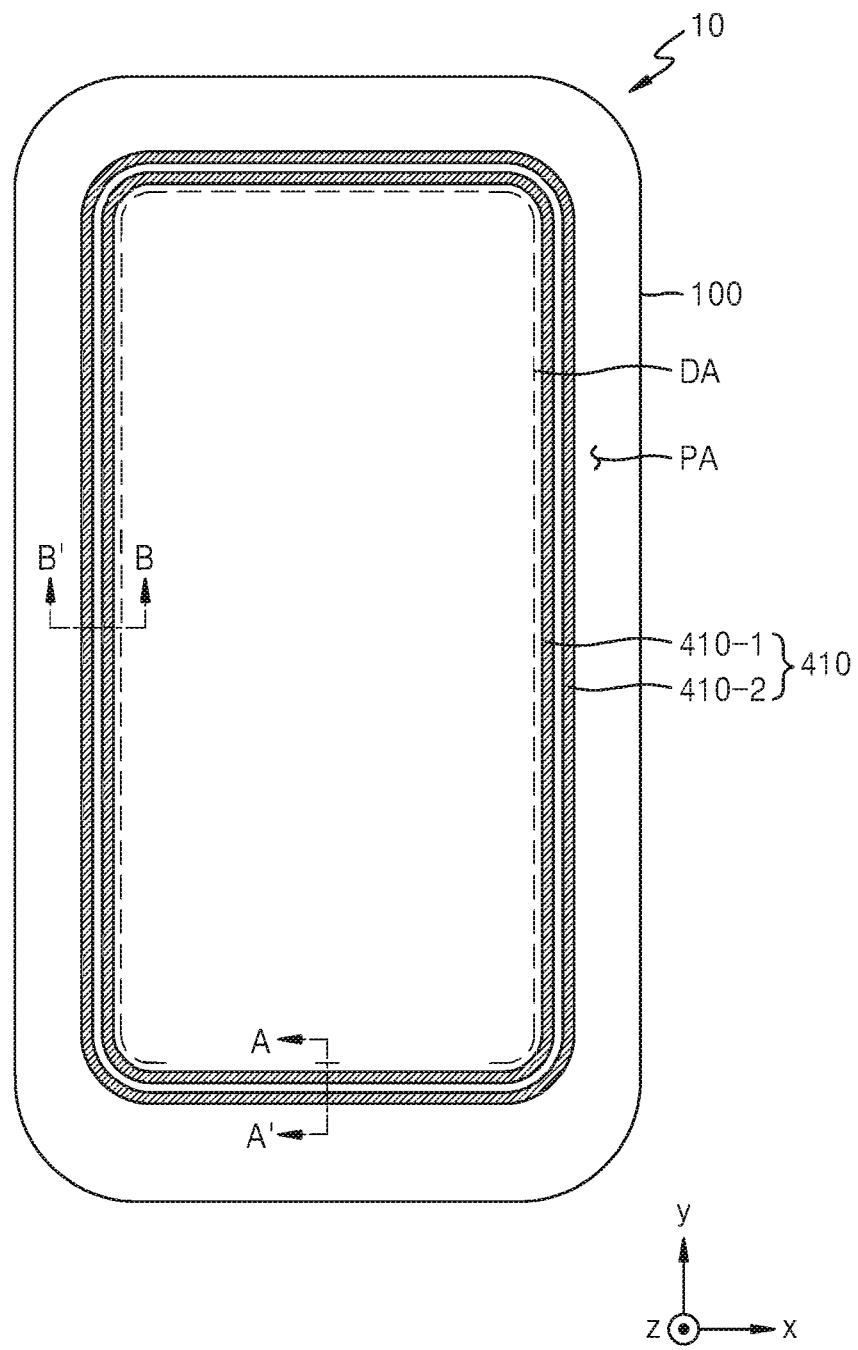
FIG. 8 is a schematic plan view of a portion of a bank protection layer and a display panel according to an embodiment.
Figure 9A:
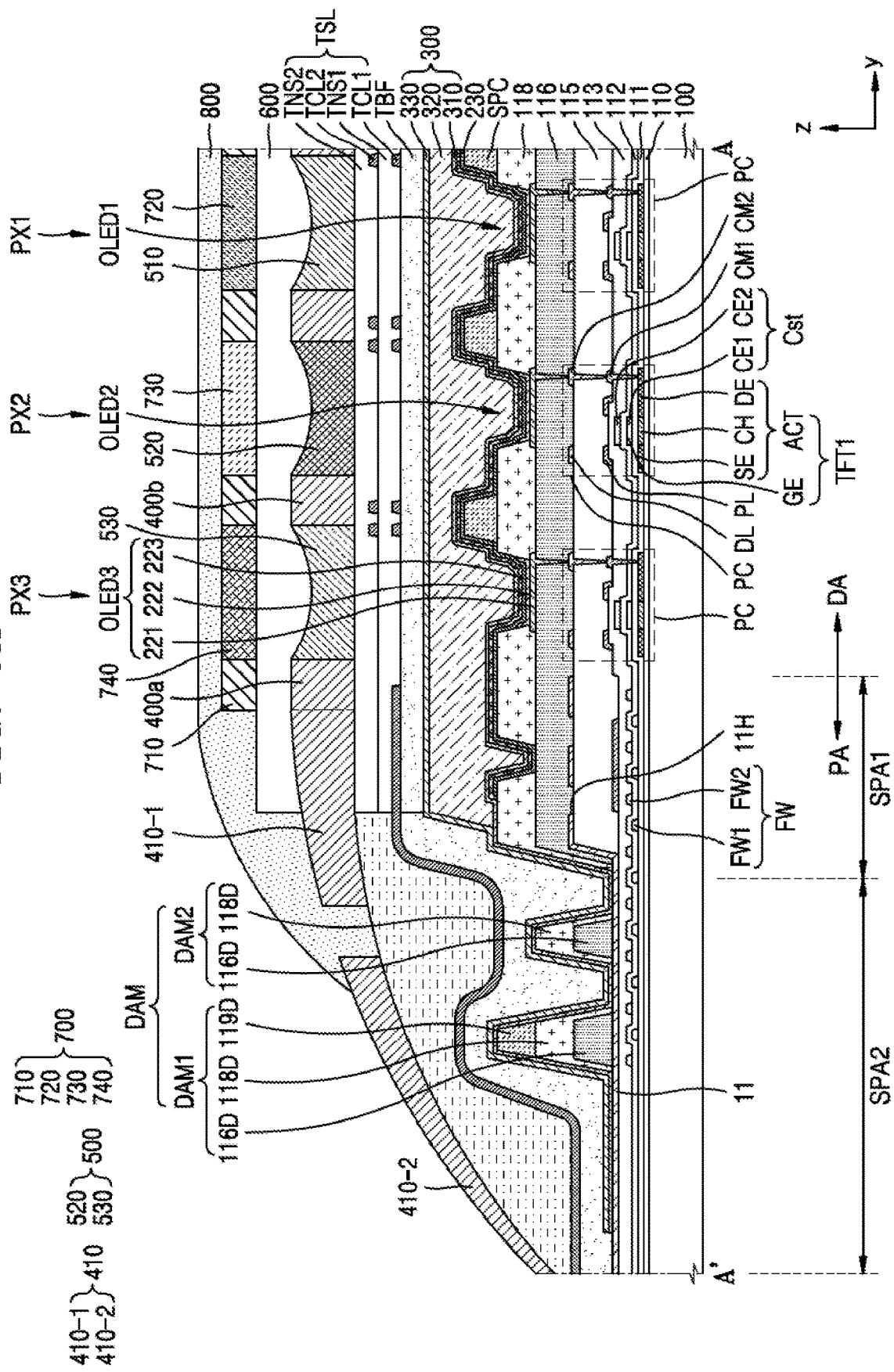
FIG. 9A is a cross-sectional view of the display panel taken along line A-A' of FIG. 8, showing a portion of a display device including a portion of the display panel.
Figure 9B:
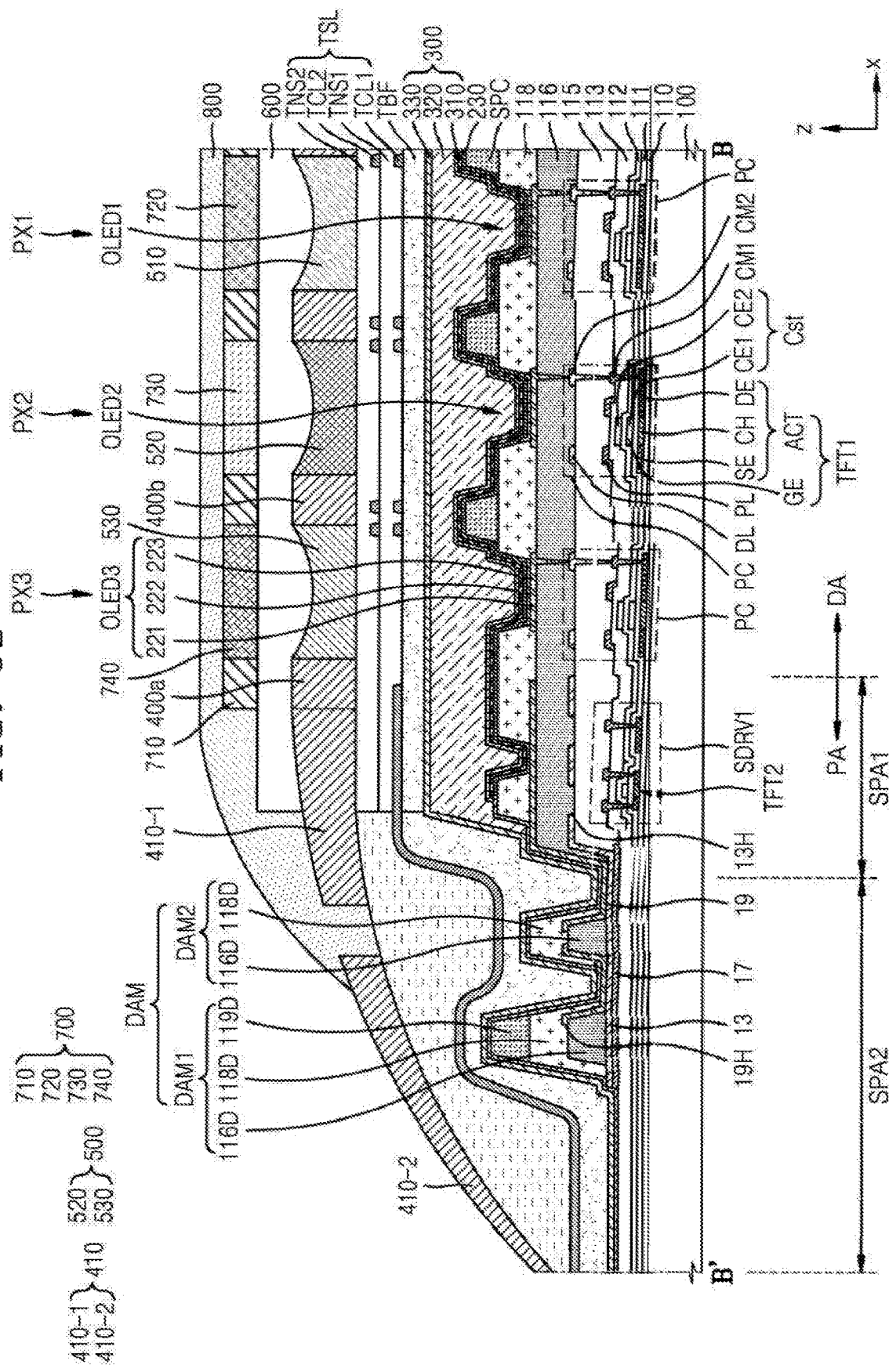
FIG. 9B is a cross-sectional view of the display panel taken along line B-B' of FIG. 8, showing a portion of a display device including a portion of the display panel.

FIG. 8 is a schematic plan view of a portion of the bank protection layer 410 and the display panel 10 according to an embodiment. FIG. 9A is a cross-sectional view of the display panel 10 taken along line A-A' of FIG. 8, showing a portion of a display device. FIG. 9B is a cross-sectional view of the display panel 10 taken along line B-B' of FIG. 8, showing a portion of a display device.

Referring to FIGS. 8 to 9B, the bank protection layer 410 may be on the display panel 10. The bank protection layer 410 may include a plurality of bank protection layers 410 spaced apart from each other. In this embodiment, the number, arrangement, and shapes of the plurality of bank protection layers 410 may be variously suitably formed. However, hereinafter, for convenience of explanation, an embodiment in which the plurality of bank protection layers 410 include two bank protection layers 410 is described in more detail.

The bank protection layer 410 may include a first bank protection layer 410-1 and a second bank protection layer 410-2. The display area DA may be inside the first bank protection layer 410-1, and the first bank protection layer 410-1 may be inside the second bank protection layer 410-2. In this embodiment, the first bank protection layer 410-1 and the second bank protection layer 410-2 may each form a closed loop when viewed in a plan view.

In this embodiment, a planar shape of each of the first bank protection layer 410-1 and the second bank protection layer 410-2 is not limited to the above. For example, the planar shape of the second bank protection layer 410-2 may be a circular ring shape, and the planar shape of the first bank protection layer 410-1 may be a square ring shape. In another embodiment, the planar shape of the second bank protection layer 410-2 may be a square ring shape and a dotted line form, and the planar shape of the first bank protection layer 410-1 may be a square ring shape. In another embodiment, both (e.g., simultaneously) the first bank protection layer 410-1 and the second bank protection layer 410-2 may have a square ring shape and a dotted line form. In another embodiment, the first bank protection layer 410-1 and the second bank protection layer 410-2 may each have another polygonal, circular, or elliptical ring shape.

The first bank protection layer 410-1 as described above may be integrally formed with a bank layer 400a arranged at an outermost portion of the display area DA or may be formed to be spaced apart from the bank layer 400a. In another embodiment, the first bank protection layer 410-1 may also be formed separately from the bank layer 400a arranged at the outermost portion of the display area DA and arranged to be spaced apart from the bank layer 400a. However, hereinafter, for convenience of explanation, an embodiment in which the first bank protection layer 410-1 is integrally formed with the bank layer 400a arranged at the outermost portion of the display area DA is mainly described in more detail.

In this embodiment, as shown in FIGS. 9A and 9B, in the first bank protection layer 410-1 and/or the second bank protection layer 410-2, a distance from one surface of the substrate 100 to an upper surface of the first bank protection layer 410-1 may be different from a distance from the one surface of the substrate 100 to the upper surface of the second bank protection layer 410-2 in one direction. The one direction may be a direction away from the display area DA.

The display device as described above may be manufactured similarly to that described with reference to FIGS. 6A to 7.

In the above embodiment, the first bank protection layer 410-1 or the second bank protection layer 410-2 may be arranged to cover an end of the first inorganic encapsulation layer 310 and an end of the second inorganic encapsulation layer 330. The second bank protection layer 410-2 at a lower portion of FIG. 8 may be arranged to cover the end of the first inorganic encapsulation layer 310 and the end of the second inorganic encapsulation layer 330, as shown in FIG. 9A. At least one of the first bank protection layer 410-1 and the second bank protection layer 410-2 may be formed concurrently (e.g., simultaneously) with the bank layer 400 in one operation or may be formed separately. In some embodiments, the first bank protection layer 410-1 and the second bank protection layer 410-2 may be formed concurrently (e.g., simultaneously) with each other in one operation or may be formed through separate operations.

Accordingly, in the display device, when the bank layer 400 is polished, lifting of the thin-film encapsulation layer 300 arranged below the bank layer 400 arranged at the outermost portion of the display area DA may be minimized or reduced. In some embodiments, because the display device includes a structure that effectively shields moisture or oxygen, so that the lifespan thereof may be increased.

Figure 10A:
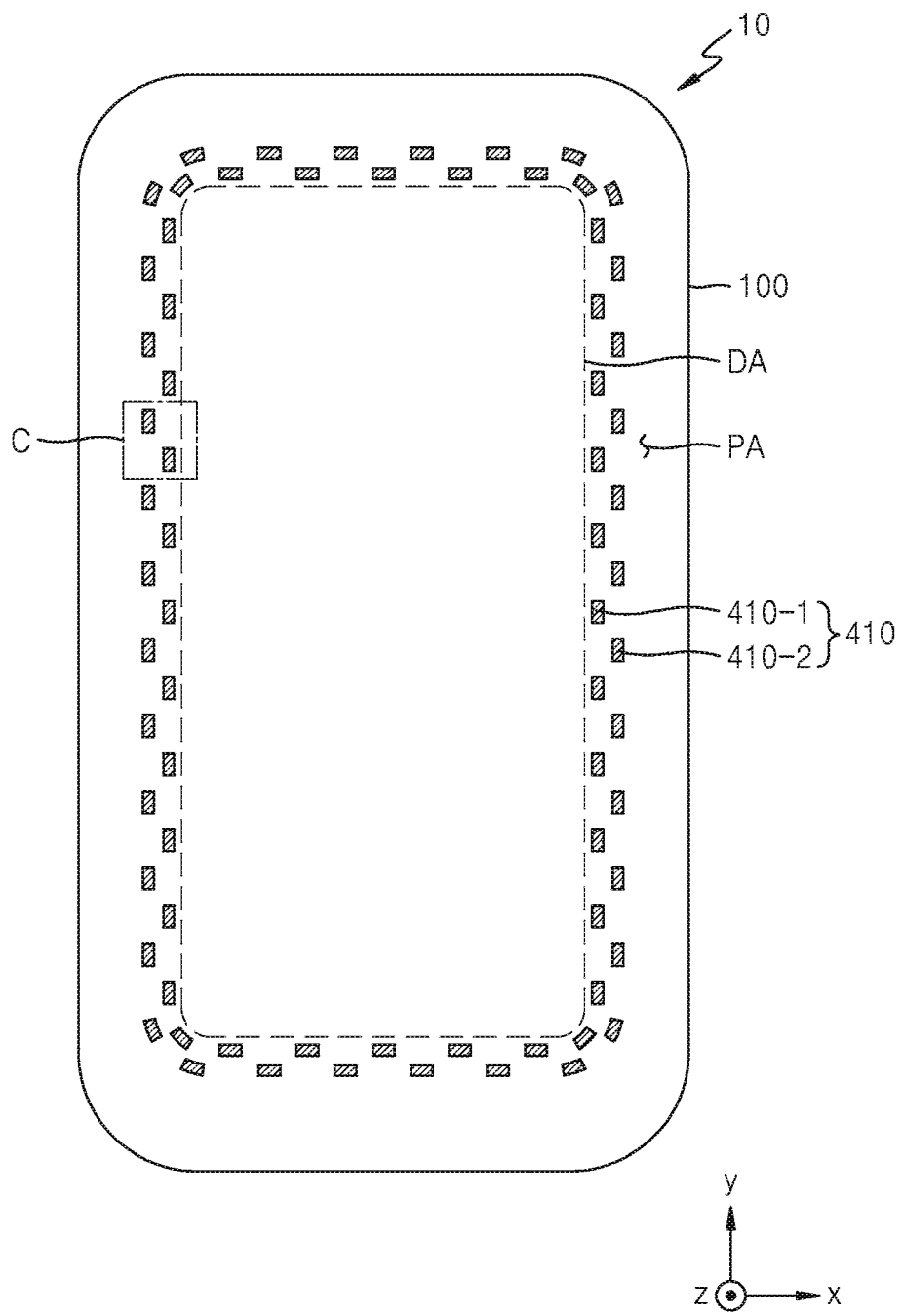
FIG. 10A is a schematic plan view of a portion of a bank protection layer and a display panel according to an embodiment.
Figure 10B:
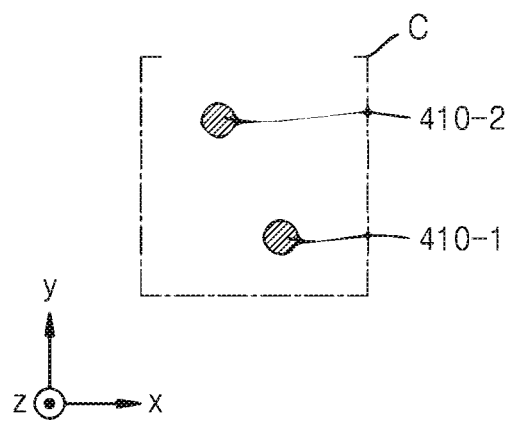
FIGS. 10B and 10C are each a schematic plan view of a bank protection layer in a portion or region C shown in FIG. 10A according to an embodiment.
Figure 10C:
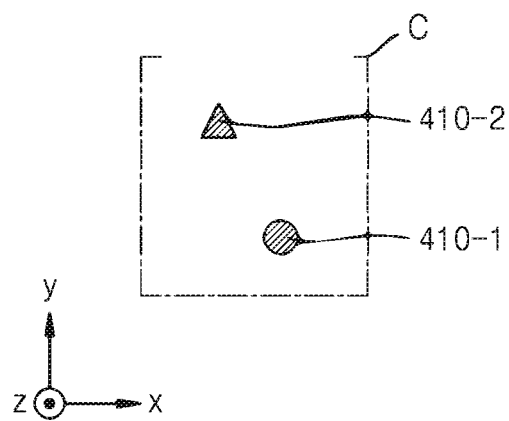

FIG. 10A is a schematic plan view of a portion of the bank protection layer 410 and the display panel 10 according to an embodiment. FIGS. 10B and 10C are each a schematic plan view of a bank protection layer in a portion or region C shown in FIG. 10A according to an embodiment.

Referring to FIGS. 10A to 10C, a plurality of bank protection layers 410 may be included. Hereinafter, for convenience of explanation, an embodiment in which the plurality of bank protection layers 410 include two bank protection layers 410 is described in more detail.

The plurality of bank protection layers 410 may include the first bank protection layer 410-1 arranged adjacent to the display area DA, and the second bank protection layer 410-2 arranged outside the first bank protection layer 410-1. The first bank protection layer 410-1 and the second bank protection layer 410-2 may be arranged at different positions. For example, the first bank protection layer 410-1 and the second bank protection layer 410-2 may each be arranged in a row as shown in FIG. 10A. In this embodiment, a plurality of first bank protection layers 410-1 may be provided. The plurality of first bank protection layers 410-1 may be arranged to be spaced apart from each other to form one shape or pattern. For example, when the plurality of first bank protection layers 410-1 are connected to each other, a rectangular ring shape may be formed. Similarly to the first bank protection layer 410-1, a plurality of the second bank protection layers 410-2 may be provided, and the plurality of second bank protection layers 410-2 may be arranged to be spaced apart from each other.

In this embodiment, the plurality of first bank protection layers 410-1 and the plurality of second bank protection layers 410-2 may be arranged in one or more suitable shapes or patterns. For example, the plurality of first bank protection layers 410-1 and the plurality of second bank protection layers 410-2 may not overlap each other when viewed from one direction (e.g., a direction perpendicular to a short side of the display area DA and/or a long side of the display area DA—in a plan view), as shown in FIG. 10A. In another embodiment, the plurality of first bank protection layers 410-1 and the plurality of second bank protection layers 410-2 may at least partially overlap each other when viewed from one direction (e.g., the direction perpendicular to a short side of the display area DA and/or a long side of the display area DA—in a plan view).

A length of the first bank protection layer 410-1 and a length of the second bank protection layer 410-2 as described above may be different from or the same as each other. In some embodiments, a width of the first bank protection layer 410-1 and a width of the second bank protection layer 410-2 may be different from or the same as each other. In this embodiment, a distance from an edge of the first bank protection layer 410-1 adjacent to the display area DA to an outermost edge of the second bank protection layer 410-2 may be about 3500 μm or more.

The planar shape of the bank protection layer 410 may vary. For example, as shown in FIG. 10B, the planar shape of the bank protection layer 410 may be circular. As another embodiment, as shown in FIG. 10C, the planar shape of the bank protection layer 410 may be a polygon such as a triangle or a square. In this case, the planar shape of the first bank protective layer 410-1 and the planar shape of the second bank protective layer 410-2 may be the same or different from each other.

Figure 11:
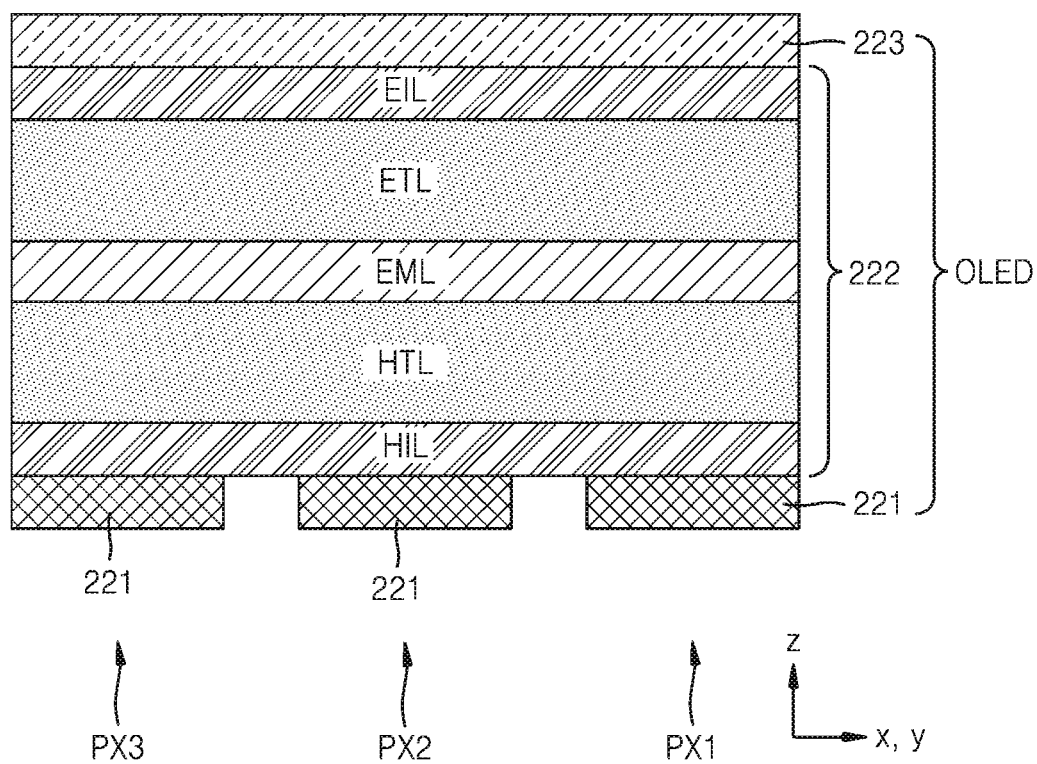
FIG. 11 is a schematic view of an organic light-emitting diode of a display panel according to an embodiment.

Referring to FIG. 11, the organic light-emitting diode OLED may be similar to the organic light-emitting diode OLED illustrated in FIGS. 6B, 6C, 9A, and 9B. Among the reference numerals shown in FIG. 11, the same reference numerals as those of FIGS. 6B, 6C, 9A, and 9B indicate the same members.

The pixel electrode 221 of the organic light-emitting diode OLED may be patterned for each of the first pixel PX1 to the third pixel PX3. In an embodiment, the intermediate layer 222 and the opposite electrode 223 of the organic light-emitting diode OLED each may be integrally provided. However, the present disclosure is not limited thereto.

The organic light-emitting diode OLED may include the intermediate layer 222, and the intermediate layer 222 may include an emission layer EML and a hole transport layer HTL. In some embodiments, the intermediate layer 222 may further include a hole injection layer HIL, an electron transport layer ETL, and an electron injection layer EIL. The hole injection layer HIL may be between the pixel electrode 221 and the hole transport layer HTL. The electron transport layer ETL may be on the emission layer EML and configured to transport an electron from the opposite electrode 223 to the emission layer EML. The electron injection layer EIL may be between the electron transport layer ETL and the opposite electrode 223.

In an embodiment, the emission layer EML may include an organic light-emitting material such as a polymer organic material or low-molecular-weight organic material that emits a certain color of light. For example, the emission layer EML may include an organic material that emits blue light. However, the present disclosure is not limited thereto. In an embodiment, the emission layer EML may include an organic material that emits red or green light, and/or may include an inorganic light-emitting material.

In this embodiment, the organic light-emitting diode OLED corresponding to each of the first pixel PX1 to the third pixel PX3 may emit light having the same wavelength band, and light emitted from organic light-emitting diodes OLED in the first pixel PX1 to the third pixel PX3 may be converted into light having different wavelength bands from each other while respectively passing through the transparent layer 510 arranged to correspond to the first pixel PX1, the second-color quantum dot layer 520 arranged to correspond to the second pixel PX2, and the third-color quantum dot layer 530 arranged to correspond to the third pixel PX3. The light passing through the transparent layer 510 may have the same wavelength band as the light emitted by the organic light-emitting diode OLED.

Thereafter, light having different wavelength bands may pass through a first-color color filter layer 720, a second-color color filter layer 730, and a third-color color filter layer 740, and only light having a certain wavelength band may pass through a first-color color filter layer 720, a second-color color filter layer 730 and a third-color color filter layer 740.

Figure 12:
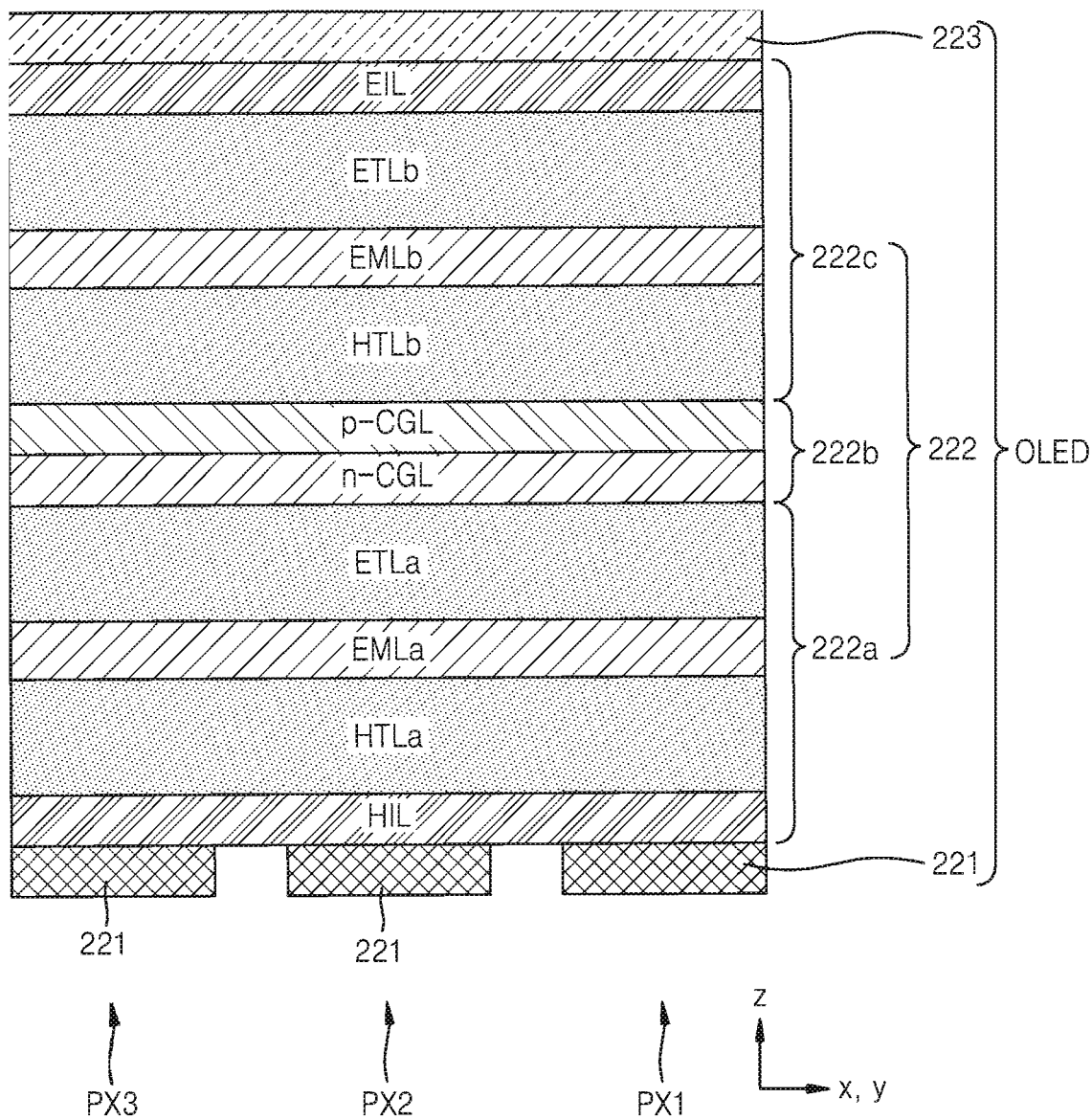
FIG. 12 is a schematic view of an organic light-emitting diode of a display panel according to an embodiment.

FIG. 12 is a schematic view of an organic light-emitting diode OLED of a display panel according to an embodiment.

Referring to FIG. 12, the organic light-emitting diode OLED may be similar to the organic light-emitting diode OLED illustrated in FIGS. 6B, 6C, 9A, and 9B. Among the reference numerals shown in FIG. 12, the same reference numerals as those of FIGS. 6B, 6C, 9A, and 9B indicate the same members.

The intermediate layer 222 of the organic light-emitting diode OLED may be provided by stacking a plurality of emission layers.

In an embodiment, the intermediate layer 222 may include a first emission layer EMLa and a second emission layer EMLb. The first emission layer EMLa and the second emission layer EMLb may include the same material. For example, the first emission layer EMLa and the second emission layer EMLb may each include an organic material that emits blue light. However, the present disclosure is not limited thereto. The first emission layer EMLa and the second emission layer EMLb may each include an organic material that emits red or green light, and/or may include an existing light-emitting material or a quantum dot.

In an embodiment, the intermediate layer 222 may include a first stack 222a including the first emission layer EMLa, a second stack 222c including the second emission layer EMLb, and a charge generation layer 222b between the first stack 222a and the second stack 222c.

In an embodiment, the first stack 222a may have a structure in which the hole injection layer HIL, a first hole transport layer HTLa, the first emission layer EMLa, and a first electron transport layer ETLa are sequentially stacked. In an embodiment, the second stack 222c may have a structure in which a second hole transport layer HTLb, the second emission layer EMLb, a second electron transport layer ETLb, and the electron injection layer EIL are sequentially stacked.

In an embodiment, the charge generation layer 222b may be configured to supply charges to the first stack 222a and the second stack 222c. In an embodiment, the charge generation layer 222b may include an N-type or kind charge generation layer n-CGL for supplying a charge to the first stack 222a, and a P-type or kind charge generation layer p-CGL for supplying a hole to the second stack 222c. The N-type or kind charge generation layer n-CGL may include a metal material as a dopant.

FIG. 12 illustrates the intermediate layer 222 of the organic light-emitting diode OLED as having two emission layers stacked, but the present disclosure is not limited thereto. The emission layer may be provided by being stacked in three, four, or more.

The intermediate layer 222 as described above may include at least one emission layer, and the emission layer may emit light having a constant wavelength band. For example, the emission layer may emit light having a wavelength in about 450 nm to about 495 nm. However, the present disclosure is not limited thereto.

In this embodiment, the organic light-emitting diode OLED corresponding to each of the first pixel PX1 to the third pixel PX3 may emit light having the same wavelength band, and light emitted from organic light-emitting diodes OLED in the first pixel PX1 to the third pixel PX3 may be converted into light having different wavelength bands from each other while respectively passing through the transparent layer 510 arranged to correspond to the first pixel PX1, the second-color quantum dot layer 520 arranged to correspond to the second pixel PX2, and the third-color quantum dot layer 530 arranged to correspond to the third pixel PX3. The light passing through the transparent layer 510 may have the same wavelength band as the light emitted by the organic light-emitting diode OLED.

Thereafter, light having different wavelength bands may pass through a first-color color filter layer 720, a second-color color filter layer 730, and a third-color color filter layer 740, and only light having a certain wavelength band may pass through a first-color color filter layer 720, a second-color color filter layer 730 and a third-color color filter layer 740.

A display device according to embodiments of the present disclosure may minimize or reduce penetration of moisture and/or oxygen. The display device according to embodiments of the present disclosure may minimize or reduce a lifting phenomenon of a thin-film encapsulation layer. The display device according to the embodiments of the present disclosure may provide a clear image.

A method of manufacturing the display device according to embodiments of the present disclosure may reduce the lifting of a thin-film encapsulation layer. The method of manufacturing the display device according to embodiments of the present disclosure may manufacture a display device that minimizes (reduces) penetration of moisture and/or oxygen.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:
1. A display device comprising:
a substrate comprising a display area in which a plurality of pixels are arranged;
a plurality of bank layers arranged on the display area of the substrate and defining opening areas respectively corresponding to the plurality of pixels; and
a bank protection layer at an outermost portion of the plurality of bank layers.
2. The display device of claim 1, wherein the bank protection layer is at an outer portion of an edge of the display area.
3. The display device of claim 1, wherein a first distance from an upper end of a first portion of the bank protection layer to one surface of the substrate is different from a second distance from an upper end of a second portion of the bank protection layer to the one surface of the substrate.
4. The display device of claim 3, wherein the first distance is greater than the second distance.
5. The display device of claim 4, wherein the first portion is closer to the display area than the second portion is to the display area.
6. The display device of claim 1, wherein a distance from an upper end of the bank protection layer to one surface of the substrate decreases in a first direction.
7. The display device of claim 6, wherein the first direction is a direction away from the display area.
8. The display device of claim 1, wherein an upper end of the bank protection layer is rounded.
9. The display device of claim 1, wherein the bank protection layer comprises an inorganic material and/or an organic material.

10. The display device of claim 1, wherein the bank protection layer comprises a material different from a material of the plurality of bank layers.

11. The display device of claim 1, wherein the bank protection layer surrounds all edges of the display area.

12. The display device of claim 11, wherein the bank protection layer has a closed-loop shape.

13. The display device of claim 11, wherein a plurality of bank protection layers are provided, and
the plurality of bank protection layers are spaced apart from each other in a direction away from the edges of the display area.

14. The display device of claim 11, wherein a plurality of bank protection layers are provided, and
the plurality of bank protection layers are spaced apart from each other along the edges of the display area.

15. The display device of claim 1, further comprising a plurality of quantum dot layers between adjacent bank layers among the plurality of bank layers.

16. The display device of claim 15, further comprising a color filter layer arranged on the plurality of quantum dot layers and the plurality of bank layers and configured to modify colors.

17. The display device of claim 1, further comprising a thin-film encapsulation layer arranged between the substrate and the plurality of bank layers and configured to shield the display area.

18. The display device of claim 17, wherein the thin-film encapsulation layer comprises:
a first inorganic encapsulation layer configured to shield the display area;
an organic encapsulation layer on the first inorganic encapsulation layer; and
a second inorganic encapsulation layer on the organic encapsulation layer.

19. The display device of claim 18, wherein the bank protection layer is configured to shield an end of the first inorganic encapsulation layer and an end of the second inorganic encapsulation layer.

20. The display device of claim 1, further comprising a dam unit on the substrate.

21. The display device of claim 20, wherein the bank protection layer is configured to shield the dam unit.

22. A display device comprising:
a substrate comprising a display area in which a plurality of pixels are arranged;
a thin-film encapsulation layer arranged on the substrate to cover the display area;
a plurality of bank layers arranged on the thin-film encapsulation layer and defining opening areas respectively corresponding to the plurality of pixels; and
a bank protection layer arranged at an outermost portion of the plurality of bank layers and having a variable distance from one surface of the substrate to an upper surface of the bank protection layer.

23. The display device of claim 22, wherein an end of the thin-film encapsulation layer is below the bank protection layer.

24. The display device of claim 22, further comprising a dam unit on the substrate and below the bank protection layer.

25. The display device of claim 22, further comprising a plurality of quantum dot layers between adjacent bank layers among the plurality of bank layers.

26. The display device of claim 25, further comprising a color filter layer arranged on the plurality of quantum dot layers and the plurality of bank layers and configured to modify colors.

27. The display device of claim 22, wherein the bank protection layer has a closed-loop shape.

28. The display device of claim 22, wherein a plurality of bank protection layers are provided, and
the plurality of bank protection layers are spaced apart from each other in a direction away from an edge of the display area.

29. The display device of claim 22, wherein a plurality of bank protection layers are provided, and
the plurality of bank protection layers are spaced apart from each other along an edge of the display area.

30. A method of manufacturing a display device, the method comprising:
forming a plurality of pixels spaced apart from each other on a substrate;
forming a thin-film encapsulation layer on a display area defined by the plurality of pixels; and
forming, on the thin-film encapsulation layer, a plurality of bank layers and a bank protection layer at an outermost portion of the plurality of bank layers to define a plurality of opening areas respectively corresponding to the plurality of pixels.

31. The method of claim 30, further comprising polishing the plurality of bank layers and the bank protection layer.

32. The method of claim 31, wherein the polishing of the bank protection layer comprises polishing the bank protection layer so that a first distance from an upper end of a first portion of the bank protection layer to one surface of the substrate is different from a second distance from an upper end of a second portion of the bank protection layer to the one surface of the substrate.

33. The method of claim 32, wherein the first distance is greater than the second distance.

34. The method of claim 33, wherein the first portion is closer to the display area than the second portion is to the display area.

35. The method of claim 31, wherein the polishing of the bank protection layer comprises polishing the bank protection layer such that a distance from an upper end of the bank protection layer to one surface of the substrate decreases in a first direction.

36. The method of claim 31, wherein an upper end of the bank protection layer is polished to be rounded.

37. The method of claim 30, wherein the bank protection layer comprises an inorganic material and/or an organic material.

38. The method of claim 30, wherein the bank protection layer has a closed-loop shape.

39. The method of claim 30, wherein the forming of the bank protection layer comprises:
forming a first bank protection layer at an outer portion of an edge of the display area; and
forming a second bank protection layer at an outer portion of the first bank protection layer.

40. The method of claim 30, further comprising forming a dam unit in an area of the substrate at an outer portion of the display area.

41. The method of claim 40, wherein the bank protection layer is configured to shield the dam unit.

42. The method of claim 30, further comprising arranging a plurality of quantum dot layers to respectively correspond to the plurality of opening areas.

43. The method of claim 42, further comprising arranging a color filter layer on the plurality of bank layers and the plurality of quantum dot layers.

\* \* \* \* \*